United States Patent
Koezuka et al.

(10) Patent No.: US 11,935,962 B2
(45) Date of Patent: Mar. 19, 2024

(54) SEMICONDUCTOR DEVICE

(71) Applicant: SEMICONDUCTOR ENERGY LABORATORY CO., LTD., Atsugi (JP)

(72) Inventors: Junichi Koezuka, Tochigi (JP); Masami Jintyou, Tochigi (JP); Yukinori Shima, Gunma (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/744,812

(22) Filed: May 16, 2022

(65) Prior Publication Data
US 2022/0278236 A1    Sep. 1, 2022

Related U.S. Application Data

(63) Continuation of application No. 16/772,982, filed as application No. PCT/IB2018/059899 on Dec. 12, 2018, now Pat. No. 11,349,032.

(30) Foreign Application Priority Data

Dec. 22, 2017    (JP) .................................. 2017-246181

(51) Int. Cl.
*H01L 29/786* (2006.01)
*H01L 21/02* (2006.01)
(Continued)

(52) U.S. Cl.
CPC .... *H01L 29/7869* (2013.01); *H01L 21/02488* (2013.01); *H01L 21/02513* (2013.01);
(Continued)

(58) Field of Classification Search
CPC ......... H01L 21/02488; H01L 21/02565; H01L 29/7869; H01L 21/02631; H01L 27/127;
(Continued)

(56) References Cited

U.S. PATENT DOCUMENTS

| 8,519,387 B2 | 8/2013 | Endo et al. |
| 8,637,348 B2 | 1/2014 | Endo et al. |

(Continued)

FOREIGN PATENT DOCUMENTS

| EP | 2518767 A | 10/2012 |
| JP | 2011-228622 A | 11/2011 |

(Continued)

OTHER PUBLICATIONS

International Search Report (Application No. PCT/IB2018/059899) dated Mar. 26, 2019.

(Continued)

*Primary Examiner* — Thanh Y. Tran
(74) *Attorney, Agent, or Firm* — Fish & Richardson P.C.

(57) ABSTRACT

A semiconductor device having favorable characteristics is provided. A semiconductor device having stable electrical characteristics is provided. An island-shaped insulating layer containing an oxide is provided in contact with a bottom surface of a semiconductor layer containing a metal oxide that exhibits semiconductor characteristics. The insulating layer containing an oxide is provided in contact with a portion of the semiconductor layer to be a channel formation region and is not provided under portions to be low-resistance regions.

16 Claims, 19 Drawing Sheets

(51) Int. Cl.
*H01L 27/12* (2006.01)
*H01L 29/66* (2006.01)
*G02F 1/1368* (2006.01)
*H10K 59/121* (2023.01)

(52) U.S. Cl.
CPC .. *H01L 21/02565* (2013.01); *H01L 21/02631* (2013.01); *H01L 27/1225* (2013.01); *H01L 27/127* (2013.01); *H01L 29/66969* (2013.01); *H01L 29/78603* (2013.01); *G02F 1/1368* (2013.01); *H10K 59/1213* (2023.02)

(58) Field of Classification Search
CPC ......... H01L 29/66969; H01L 29/78603; H01L 27/3262; H01L 29/78648; H01L 21/02554; H01L 29/4908; H01L 21/76834; H10K 59/1213
See application file for complete search history.

(56) References Cited

U.S. PATENT DOCUMENTS

| | | | |
|---|---|---|---|
| 8,664,118 B2 | 3/2014 | Ishizuka et al. | |
| 8,860,023 B2 | 10/2014 | Tsubuku et al. | |
| 8,975,115 B2 | 3/2015 | Endo et al. | |
| 9,035,305 B2 | 5/2015 | Tsubuku et al. | |
| 9,111,795 B2 | 8/2015 | Ieda et al. | |
| 9,281,407 B2 | 3/2016 | Tsubuku et al. | |
| 9,496,408 B2 | 11/2016 | Yamazaki et al. | |
| 9,496,413 B2 | 11/2016 | Tsubuku et al. | |
| 9,741,865 B2 | 8/2017 | Yamazaki et al. | |
| 9,773,810 B2 | 9/2017 | Ieda et al. | |
| 9,837,547 B2 | 12/2017 | Koezuka et al. | |
| 9,859,437 B2 | 1/2018 | Morosawa et al. | |
| 9,899,536 B2 | 2/2018 | Yamazaki et al. | |
| 10,319,861 B2 | 6/2019 | Koezuka et al. | |
| 10,388,670 B2 | 8/2019 | Ieda et al. | |
| 10,910,404 B2 | 2/2021 | Ieda et al. | |
| 2012/0018727 A1 | 1/2012 | Endo et al. | |
| 2012/0161125 A1* | 6/2012 | Yamazaki | H10B 12/00 257/E21.409 |
| 2014/0151688 A1* | 6/2014 | Yamazaki | H01L 29/247 257/43 |
| 2016/0343866 A1 | 11/2016 | Koezuka et al. | |
| 2017/0025544 A1 | 1/2017 | Yamazaki et al. | |
| 2017/0104090 A1 | 4/2017 | Koezuka et al. | |
| 2019/0245091 A1 | 8/2019 | Koezuka et al. | |
| 2020/0328282 A1* | 10/2020 | Yamazaki | H05B 33/14 |

FOREIGN PATENT DOCUMENTS

| | | |
|---|---|---|
| JP | 2012-049513 A | 3/2012 |
| JP | 2013-008946 A | 1/2013 |
| JP | 2013-038404 A | 2/2013 |
| JP | 2014-007399 A | 1/2014 |
| JP | 2015-005705 A | 1/2015 |
| JP | 2017-028252 A | 2/2017 |
| JP | 2017-028288 A | 2/2017 |
| JP | 2017-028324 A | 2/2017 |
| JP | 2017-076788 A | 4/2017 |
| KR | 2012-0082800 A | 7/2012 |
| TW | 201220496 | 5/2012 |
| TW | 201711205 | 3/2017 |
| WO | WO-2016/189411 | 12/2016 |

OTHER PUBLICATIONS

Written Opinion (Application No. PCT/IB2018/059899) dated Mar. 26, 2019.

* cited by examiner

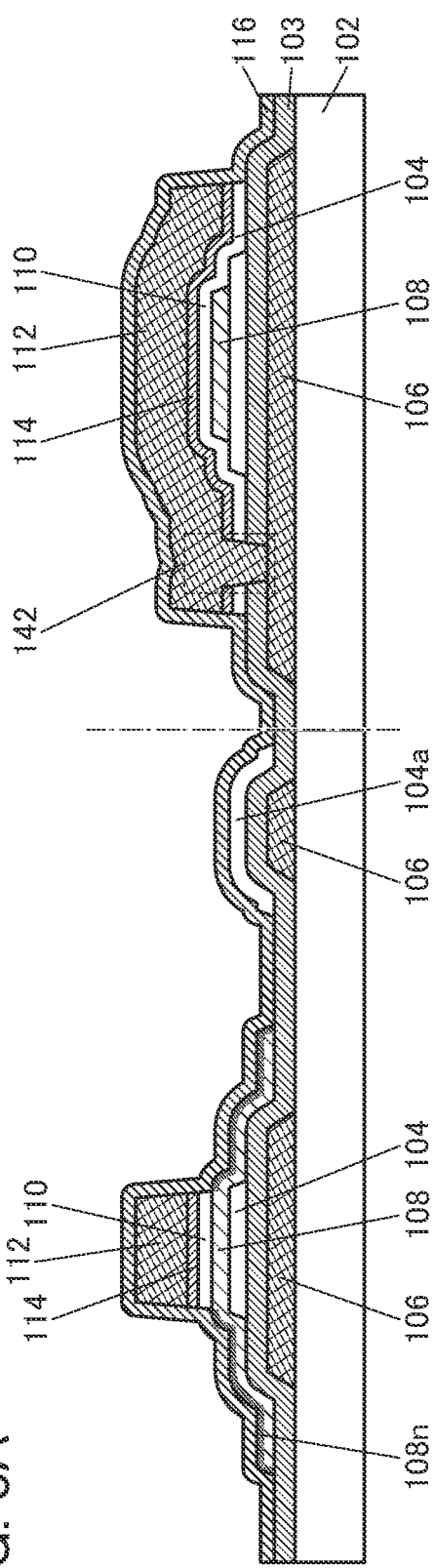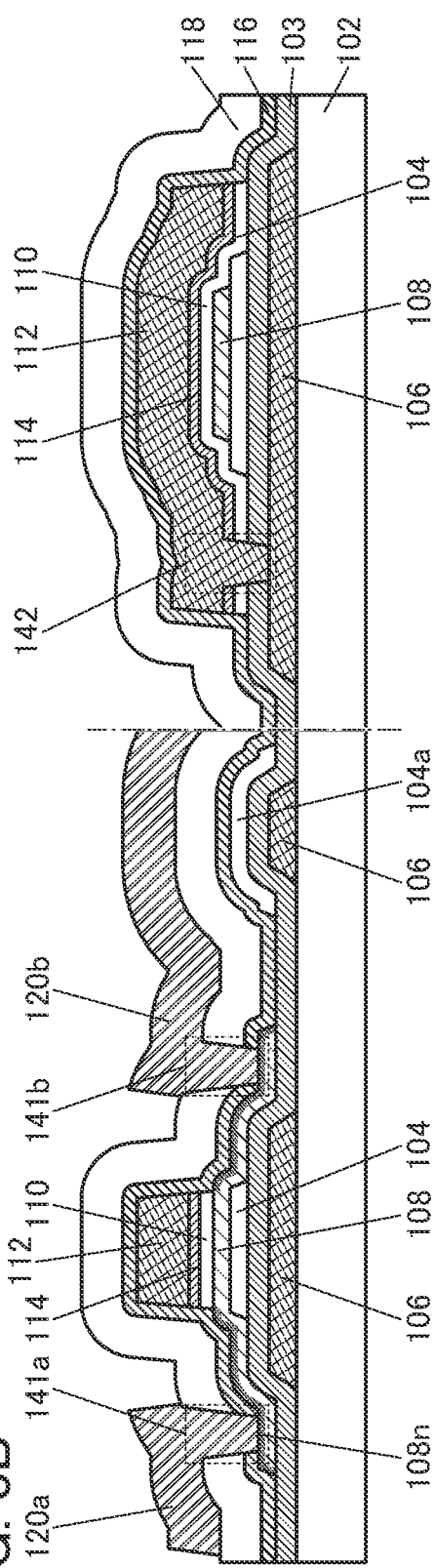

SEMICONDUCTOR DEVICE

CROSS REFERENCE TO RELATED APPLICATIONS

This application is a continuation of U.S. application Ser. No. 16/772,982, filed Jun. 15, 2020, now allowed, which is incorporated by reference and is a U.S. National Phase Application under 35 U.S.C. § 371 of International Application PCT/IB2018/059899, filed on Dec. 12, 2018, which is incorporated by reference and claims the benefit of a foreign priority application filed in Japan on Dec. 22, 2017, as Application No. 2017-246181, all of which are incorporated by reference.

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or µFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. A transistor using a metal oxide has field-effect mobility higher than that in the case where amorphous silicon is used; therefore, a high-performance display device provided with driver circuits can be achieved.

Patent Document 2 discloses a thin film transistor in which an oxide semiconductor film including a low-resistance region containing at least one kind in a group consisting of aluminum, boron, gallium, indium, titanium, silicon, germanium, tin, and lead as a dopant is used for a source region and a drain region.

REFERENCE

Patent Document

[Patent Document 1] Japanese Published Patent Application No. 2014-7399
[Patent Document 2] Japanese Published Patent Application No. 2011-228622

SUMMARY OF THE INVENTION

Problems to be Solved by the Invention

One object of one embodiment of the present invention is to provide a semiconductor device having favorable electrical characteristics. Another object is to provide a semiconductor device having stable electrical characteristics. Another object of one embodiment of the present invention is to provide a highly reliable semiconductor device.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a semiconductor device including a first insulating layer, a second insulating layer, a third insulating layer, a semiconductor layer, and a first conductive layer. The second insulating layer is positioned over the first insulating layer and has an island shape. The semiconductor layer includes a portion in contact with a top surface of the second insulating layer and a portion in contact with a top surface of the first insulating layer, and has an island shape. The third insulating layer and the first conductive layer are provided to be stacked in this order over the semiconductor layer. The second insulating layer is provided at least in a region where the first conductive layer and the semiconductor layer overlap. The semiconductor layer extends to an outer side beyond a pair of end portions of the second insulating layer in the channel length direction, and is positioned on an inner side compared to a pair of end portions of the second insulating layer in the channel width direction. The semiconductor layer contains a metal oxide, the first insulating layer contains a metal oxide or a nitride, and the second insulating layer and the third insulating layer contain an oxide.

In the above, a second conductive layer and a third conductive layer are preferably included. In that case, it is preferred that the second conductive layer and the third conductive layer be provided apart from each other with the second insulating layer positioned therebetween, and be each in contact with the semiconductor layer in a region where the second insulating layer is not provided.

In the above, a fourth insulating layer is preferably included. In that case, it is preferred that the fourth insulating layer cover the second insulating layer, the semiconductor layer, the third insulating layer, and the first conductive layer, include a portion in contact with part of a top surface of the semiconductor layer in a region where the second insulating layer is not provided, and include a portion in contact with the first insulating layer on an outer side compared to an end portion of the semiconductor layer. Furthermore, the fourth insulating layer preferably contains a metal oxide or a nitride.

In the above, the fourth insulating layer preferably contains silicon nitride or aluminum nitride.

In the above, the first insulating layer preferably contains silicon nitride or aluminum oxide.

In the above, it is preferable to include a fourth conductive layer under the first insulating layer. In that case, the fourth conductive layer preferably includes a region overlapped by all the semiconductor layer, the first conductive layer, and the second insulating layer.

In the above, it is preferable to include a fifth insulating layer in a region where the semiconductor layer is not provided and the second conductive layer and the fourth conductive layer overlap. In that case, it is preferred that the fifth insulating layer be positioned on the same surface as the second insulating layer and contain the same material as the second insulating layer.

In the above, it is preferable to include a metal oxide layer between the third insulating layer and the first conductive layer. In that case, the metal oxide layer and the semiconductor layer preferably contain an identical metal element. Alternatively, the metal oxide layer preferably contains aluminum or hafnium.

Effect of the Invention

According to one embodiment of the present invention, a semiconductor device having favorable electrical characteristics can be provided. A semiconductor device having stable electrical characteristics can be provided. A highly reliable display device can be provided.

Note that the description of these effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIGS. 8A and 8B Diagrams illustrating a method for manufacturing a transistor.
FIGS. 9A and 9B Top views of display devices.

MODE FOR CARRYING OUT THE INVENTION

Figure 1A:
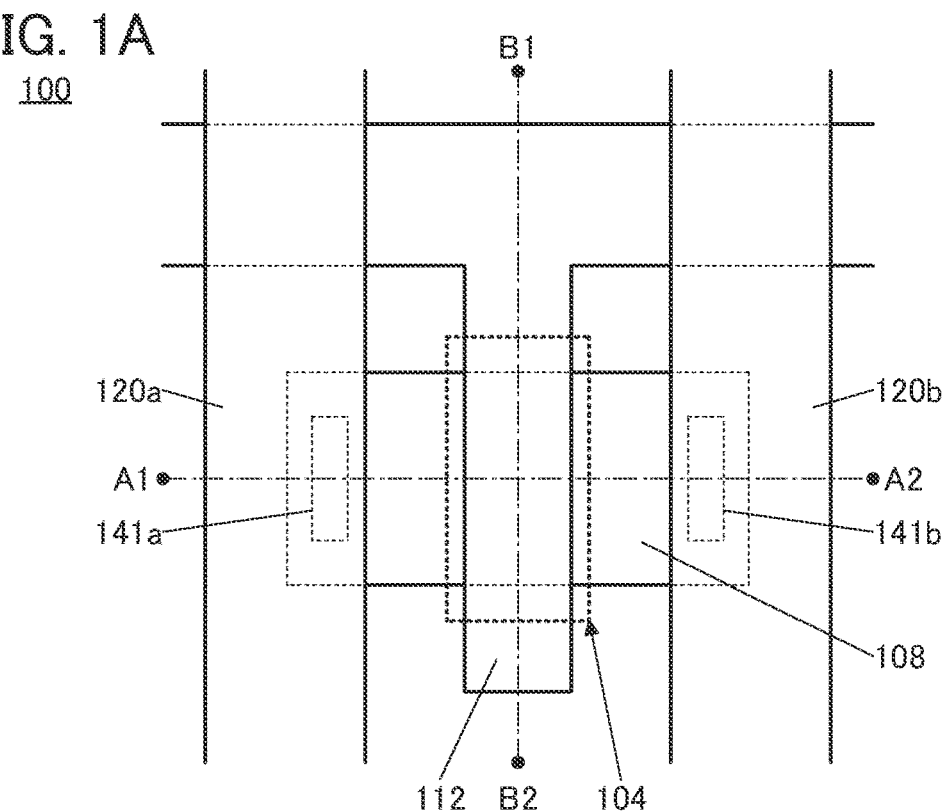
FIGS. 1A to 1C A structure example of a transistor.

Hereinafter, embodiments will be described with reference to the drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description are not limited to those used in this specification, and the description can be changed appropriately depending on the situation.

In this specification and the like, functions of a source and a drain of a transistor might be switched when a transistor of opposite polarity is employed or the direction of current flow is changed in circuit operation, for example. Therefore, the terms "source" and "drain" can be used interchangeably.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, an off-state current in this specification and the like refers to a drain current of a transistor in an off state (also referred to as a non-conducting state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of the display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can be referred to as, for example, a display panel (or a display device) with a touch sensor or a display panel (or a display device) having a touch sensor function. A touch panel can include a display panel and a touch sensor panel. Alternatively, a touch panel can have a function of a touch sensor on the inside or a surface of the display panel.

In this specification and the like, a substrate of a touch panel on which a connector and an IC are mounted is referred to as a touch panel module, a display module, or simply a touch panel or the like in some cases.

Embodiment 1

In this embodiment, a semiconductor device and a display device of one embodiment of the present invention and a manufacturing method thereof will be described.

One embodiment of the present invention is a transistor including, over a formation surface, a semiconductor layer in which a channel is formed, a gate insulating layer (also referred to as a third insulating layer) over the semiconductor layer, and a gate electrode over the gate insulating layer. The semiconductor layer preferably contains a metal oxide exhibiting semiconductor characteristics (hereinafter also referred to as an oxide semiconductor).

Preferably, the top surface shapes of the gate electrode and the gate insulating layer are substantially the same. In other words, the gate electrode and the gate insulating layer are preferably processed so that their side surfaces are continuous. For example, the gate electrode and the gate insulating layer can be formed in such a manner that an insulating film to be the gate insulating layer and a conductive film to be the gate electrode are stacked and then successively processed with the use of one etching mask. Alternatively, the gate insulating layer may be formed by processing the insulating film with the use of the gate electrode that has been processed in advance as a hard mask.

The semiconductor layer includes a channel formation region where a channel can be formed and a pair of low-resistance regions functioning as a source region and a drain region. The channel formation region is a region of the semiconductor layer that is overlapped by the gate electrode. The pair of low-resistance regions are regions provided so that the channel formation region is positioned therebetween and having a lower resistance than the channel formation region.

Note that in this specification and the like, the channel length direction of a transistor refers to one of directions parallel to the straight line that connects a source region and a drain region in the shortest distance. In other words, the channel length direction corresponds to one of directions of current flowing through a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

Here, an island-shaped insulating layer containing an oxide (also referred to as a second insulating layer) is preferably provided in contact with a bottom surface of the semiconductor layer. When the second insulating layer containing an oxide is provided in contact with the semiconductor layer, oxygen that is released by heating can be supplied to the semiconductor layer effectively and oxygen vacancies in the semiconductor layer can be filled.

It is preferred that the second insulating layer containing an oxide be provided in contact with a portion of the semiconductor layer to be the channel formation region and not be provided under portions to be the low-resistance regions. Accordingly, the low-resistance regions become regions including more oxygen vacancies than the channel formation region, thereby obtaining the regions in which carriers are easily generated and the resistance has been lowered more effectively.

Furthermore, an insulating layer containing a nitride (also referred to as a fourth insulating layer) is provided in contact with surfaces of the low-resistance regions of the semiconductor layer. When the insulating layer containing a nitride is provided in contact with the semiconductor layer, the effect of further increasing the conductivity of the low-resistance regions is attained. Furthermore, it is preferable that heat treatment be performed in a state where the insulating layer containing a nitride is provided in contact with the semiconductor layer, because a reduction in the resistance is further promoted.

The fourth insulating layer is preferably provided to cover a first conductive layer. Accordingly, the fourth insulating layer can be formed to be in contact only with portions other than the channel formation region of the semiconductor layer and not to be in contact with a portion of the semiconductor layer over which the first conductive layer is provided, that is, the channel formation region. As a result, the low-resistance regions whose resistance is lowered in a self-aligned manner can be formed.

As the nitride, for example, a nitride of a semiconductor material, such as silicon nitride or gallium nitride, or a metal nitride such as aluminum nitride is particularly preferably used. For example, in the case of using silicon nitride, the use of silicon nitride containing hydrogen is further preferable. Because of having a blocking property against hydrogen and oxygen, silicon nitride can prevent both diffusion of hydrogen from the outside into the semiconductor layer and release of oxygen from the semiconductor layer to the outside, and can achieve a highly reliable transistor.

In the case of using a metal nitride, it is particularly preferable that aluminum be contained. For example, an aluminum nitride film formed by a reactive sputtering method using aluminum as a sputtering target and a nitrogen-containing gas as a deposition gas can be a film having both an extremely high insulating property and an extremely high blocking property against hydrogen and oxygen when the flow rate of a nitrogen gas with respect to the total flow rate of the deposition gas is appropriately controlled. Thus, when such an insulating film containing a metal nitride is provided in contact with the semiconductor layer, the resistance of the semiconductor layer can be lowered, and release of oxygen from the semiconductor layer and diffusion of hydrogen into the semiconductor layer can be favorably prevented.

In the case where aluminum nitride is used as the metal nitride, the thickness of the insulating layer containing aluminum nitride is preferably 5 nm or more. A film with such a small thickness can have both a high blocking property against hydrogen and oxygen and a function of lowering the resistance of the semiconductor layer. Note that there is no upper limit of the thickness of the insulating layer; however, the thickness is preferably less than or equal to 500 nm, further preferably less than or equal to 200 nm, still further preferably less than or equal to 50 nm in consideration of productivity.

As described above, in one embodiment of the present invention, the second insulating layer has an island shape. Moreover, an insulating layer having a high blocking property against water, hydrogen, and oxygen (also referred to as a first insulating layer) is preferably provided under the second insulating layer. For the first insulating layer, a metal oxide or the above-described nitride can be used. The metal oxide particularly preferably contains a material having a high blocking property against hydrogen and oxygen, such as aluminum oxide or hafnium oxide.

Furthermore, it is preferable that the first insulating layer and the fourth insulating layer be in contact with each other on the outer side compared to the island-shaped semiconductor layer and the island-shaped second insulating layer. In other words, it is preferable that the semiconductor layer and the second insulating layer be surrounded (sealed) by the first insulating layer and the fourth insulating layer. Accordingly, oxygen released from the second insulating layer can be effectively prevented from being released to the outside, and most of the oxygen can be supplied to the portion to be channel formation region in the semiconductor layer.

Employing the above structures makes it possible to achieve a semiconductor device having excellent electrical characteristics and high reliability.

More specific examples will be described below with reference to drawings.

Structure Example 1

Figure 1B:
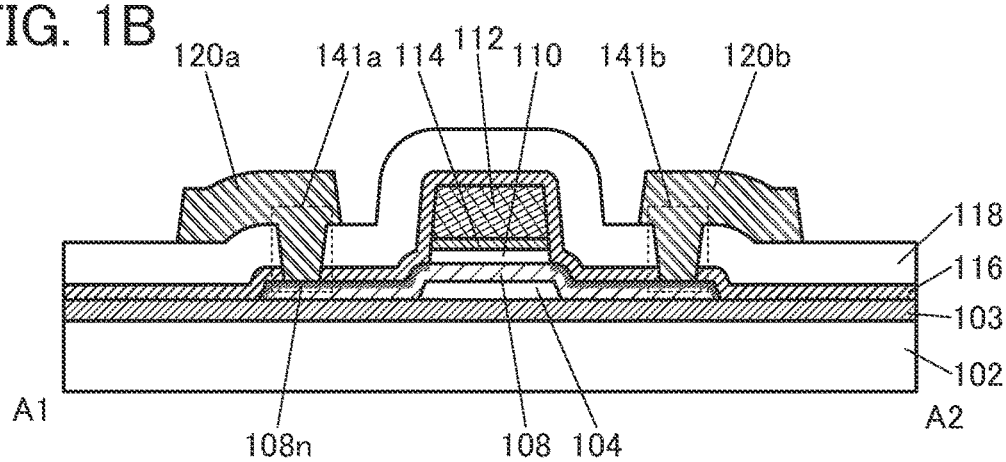
Figure 1C:
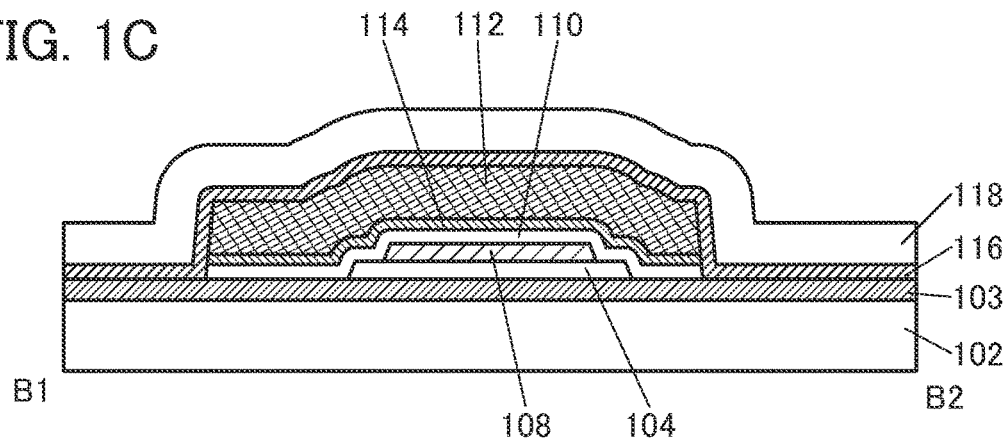

FIG. 1(A) is a top view of a transistor 100, FIG. 1(B) corresponds to a cross-sectional view of a cut plane along the dashed-dotted line A1-A2 in FIG. 1(A), and FIG. 1(C) corresponds to a cross-sectional view of a cut plane along the dashed-dotted line B1-B2 in FIG. 1(A). Note that in FIG. 1(A), some components (e.g., a gate insulating layer) of the transistor 100 are not illustrated. The direction of the dashed-dotted line A1-A2 corresponds to the channel length direction, and the direction of the dashed-dotted line B1-B2 corresponds to the channel width direction. Some components are not illustrated in top views of transistors in the following drawings, as in FIG. 1(A).

The transistor 100 is provided over a substrate 102 and includes an insulating layer 103, an insulating layer 104, a semiconductor layer 108, an insulating layer 110, a metal oxide layer 114, a conductive layer 112, an insulating layer 116, an insulating layer 118, and the like. The insulating layer 104 is provided over the insulating layer 103, and the semiconductor layer 108 is provided in contact with top surfaces of the insulating layer 103 and the insulating layer 104. The insulating layer 110, the metal oxide layer 114, and the conductive layer 112 are stacked in this order to cover part of the semiconductor layer 108. The insulating layer 116 is provided to cover the insulating layer 104, a top surface and a side surface of the semiconductor layer 108, a side surface of the insulating layer 110, a side surface of the metal oxide layer 114, and a top surface and a side surface of the conductive layer 112. The insulating layer 118 is provided to cover the insulating layer 116.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

The semiconductor layer 108 preferably contains a metal oxide.

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably aluminum, gallium, yttrium, or tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

The semiconductor layer 108 includes a region overlapped by the conductive layer 112 and low-resistance regions 108n between which the region is positioned. The insulating layer 116 is provided in contact with the regions 108n. The region of the semiconductor layer 108 that is overlapped by the conductive layer 112 functions as a channel formation region of the transistor 100. Meanwhile, the regions 108n function as a source region and a drain region of the transistor 100.

As illustrated in FIGS. 1(A) and 1(B), the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to the regions 108n through an opening 141a and an opening 141b, respectively, which are provided in the insulating layer 118 and the insulating layer 116.

The top surface shapes of the conductive layer 112, the metal oxide layer 114, and the insulating layer 110 are substantially the same.

Note that in this specification and the like, the expression "top surface shapes are substantially the same" means that the outlines of stacked layers overlap at least partly. For example, the case of processing or partly processing an upper layer and a lower layer with the use of the same mask pattern is included. However, in some cases, the outlines do not completely overlap and the upper layer is positioned on the inner side of the lower layer or the upper layer is positioned on the outer side of the lower layer; such a case is also represented by the expression "top surface shapes are substantially the same".

The metal oxide layer 114 positioned between the insulating layer 110 and the conductive layer 112 functions as a barrier film that prevents oxygen contained in the insulating layer 110 from being diffused into the conductive layer 112 side. Furthermore, the metal oxide layer 114 also functions as a barrier film that prevents diffusion of hydrogen and water contained in the conductive layer 112 into the insulating layer 110 side. For the metal oxide layer 114, a material that is less likely to transmit oxygen and hydrogen than at least the insulating layer 110 can be used, for example.

Even in the case where a material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, supply of hydrogen from the conductive layer 112 to the semiconductor layer 108 through the insulating layer 110 is inhibited. Consequently, the carrier density of the channel formation region of the semiconductor layer 108 can be extremely low.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

In particular, an insulating material having a higher permittivity than silicon oxide is preferably used for the metal oxide layer 114. It is particularly preferable to use an aluminum oxide film, a hafnium oxide film, a hafnium aluminate film, or the like.

The metal oxide layer 114 is preferably formed using a sputtering apparatus. For example, when an aluminum oxide film is formed using a sputtering apparatus, formation in an atmosphere containing an oxygen gas enables oxygen to be added to the insulating layer 110 and the semiconductor layer 108 in a favorable manner. Moreover, an aluminum oxide film formed with a sputtering apparatus is preferable because the film density can be increased.

For the metal oxide layer 114, an oxide semiconductor material that can be used for the semiconductor layer 108 can be used. At this time, a metal oxide film formed using the same sputtering target as that for the semiconductor layer 108 is preferably used, in which case the same apparatus can be employed.

Alternatively, when a metal oxide material containing indium and gallium is used for both the semiconductor layer 108 and the metal oxide layer 114, a material whose composition (content ratio) of gallium is higher than that in the semiconductor layer 108 is preferably used, in which case the blocking property against oxygen can be further increased. Here, when the semiconductor layer 108 is formed using a material whose composition of indium is higher than that in the metal oxide layer 114, the field-effect mobility of the transistor 100 can be increased.

As the insulating layer 116, an insulating film containing a metal nitride can be used. For example, for example, a nitride of a semiconductor material, such as silicon nitride or gallium nitride, or a metal nitride such as aluminum nitride can be used. The insulating film containing a metal nitride preferably contains at least one of metal elements such as aluminum, titanium, tantalum, tungsten, chromium, and ruthenium and nitrogen, for example. In particular, a film containing aluminum and nitrogen is preferable because of its extremely high insulating property.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 100 can be increased.

Alternatively, an aluminum titanium nitride film, a titanium nitride film, or the like can be used as the insulating layer 116.

The region 108$n$ is part of the semiconductor layer 108 and is a region having a lower resistance than the channel formation region.

Here, in the case where a metal oxide film containing indium is used as the semiconductor layer 108, a region where indium oxide is precipitated or a region having a high indium concentration is sometimes formed in the region 108$n$ in the vicinity of the interface with the insulating layer 116. Such a region can sometimes be observed by an analysis method such as X-ray photoelectron spectroscopy (XPS), for example.

The region 108$n$ can be regarded as a region having a higher carrier concentration or a region having a higher oxygen defect density than the channel formation region, or an n-type region.

As the insulating layer 104 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, heat treatment performed in the manufacturing process of the transistor 100 enables oxygen released from the insulating layer 104 or the insulating layer 110 to be supplied to the channel formation region of the semiconductor layer 108, thereby reducing oxygen vacancies in the semiconductor layer 108.

As the insulating layer 103 provided under the insulating layer 104 (on the substrate 102 side), an insulating film through which oxygen and hydrogen are less likely to diffuse is preferably used. In particular, it is possible to use a metal oxide film such as an aluminum oxide film, a hafnium oxide film, or a hafnium aluminate film; or an insulating film containing nitrogen, such as aluminum nitride, aluminum nitride oxide, silicon nitride, or silicon nitride oxide.

An aluminum oxide film, a hafnium oxide film, a hafnium aluminate film, and the like have an extremely high barrier property even when their thickness is small. Accordingly, the thickness can be greater than or equal to 0.5 nm and less than or equal to 50 nm, preferably greater than or equal to 1 nm and less than or equal to 40 nm, further preferably greater than or equal to 2 nm and less than or equal to 30 nm. In particular, an aluminum oxide film has a high barrier property against hydrogen or the like and thus gives an adequate effect even when having an extremely small thickness (e.g., greater than or equal to 0.5 nm and less than or equal to 1.5 nm). Such a film can be formed by a film formation method such as a sputtering method or an atomic layer deposition (ALD) method.

Here, the semiconductor layer 108 and the insulating layer 104 are processed into island shapes. In FIG. 1(A), the outline of the insulating layer 104 is denoted by the dashed line.

End portions of the insulating layer 104 in the channel length direction are positioned on the inner side compared to end portions of the semiconductor layer 108. Meanwhile, its end portions in the channel width direction are positioned on the outer side compared to end portions of the semiconductor layer 108. It can also be said that the semiconductor layer 108 extends to the outer side beyond the pair of end portions of the insulating layer 104 in the channel length direction, and is positioned on the inner side compared to the pair of end portions of the insulating layer 104 in the channel width direction.

The insulating layer 104 is provided so as to be overlapped by the channel formation region in the semiconductor layer 108. The regions 108$n$ of the semiconductor layer 108 include a region that does not overlap the insulating layer 104. Preferably, the insulating layer 104 is not provided at least in a portion in contact with the conductive layer 120*a* and a portion in contact with the conductive layer 120*b* in the regions 108*n*.

In addition, as illustrated in FIGS. 1(B) and 1(C), the insulating layer 103 and the insulating layer 116 are provided in contact with each other in regions on the outer side compared to the semiconductor layer 108 and the insulating layer 104. Thus, the semiconductor layer 108, the insulating layer 104, and the like can be sealed with the insulating layer 103 and the insulating layer 116. Such a structure can effectively inhibit diffusion of hydrogen from the outside into the semiconductor layer 108, the insulating layer 104, and the like of the transistor 100 and diffusion of oxygen in the semiconductor layer 108 and the insulating layer 104 to the outside.

Although the insulating layer 118 contains hydrogen in some cases, the insulating layer 104 and the insulating layer 110, each of which includes an oxide film and is in contact with the semiconductor layer 108, are not in contact with the insulating layer 118 owing to the insulating layer 116. Thus, even if the insulating layer 118 contains hydrogen, it is possible to effectively prevent diffusion of the hydrogen into the semiconductor layer 108 through the insulating layer 104 and the insulating layer 110, which would be caused, for example, by heat applied in the manufacturing process of the transistor 100.

Here, the semiconductor layer 108 and oxygen vacancies that might be formed in the semiconductor layer 108 will be described.

Oxygen vacancies formed in the semiconductor layer 108 adversely affect the transistor characteristics and therefore cause a problem. For example, if an oxygen vacancy is formed in the semiconductor layer 108, the oxygen vacancy might be bonded with hydrogen to serve as a carrier supply source. The carrier supply source generated in the semiconductor layer 108 causes a change in the electrical characteristics, typically a shift in the threshold voltage, of the transistor 100. Therefore, the amount of oxygen vacancies in the semiconductor layer 108 is preferably as small as possible.

In view of this, in one embodiment of the present invention, the insulating films near the semiconductor layer 108, specifically, the insulating layer 110 positioned above the semiconductor layer 108 and the insulating layer 104 positioned below the semiconductor layer 108 each include an oxide film. When oxygen is moved from the insulating layer 104 and the insulating layer 110 to the semiconductor layer 108 by heat during the manufacturing process or the like, the amount of oxygen vacancies in the semiconductor layer 108 can be reduced.

Furthermore, the semiconductor layer 108 preferably includes a region where the atomic proportion of In is higher than the atomic proportion of M. A higher atomic proportion of In results in higher field-effect mobility of the transistor.

Here, in the case of a metal oxide containing In, Ga, and Zn, bonding strength between In and oxygen is weaker than bonding strength between Ga and oxygen; hence, with a higher atomic proportion of In, oxygen vacancies tend to be generated in the metal oxide film. There is a similar tendency when a metal element shown above as M is used instead of Ga. The existence of a large amount of oxygen vacancies in the metal oxide film leads to deterioration of electrical characteristics and reduction in reliability of a transistor.

In contrast, in one embodiment of the present invention, an extremely large amount of oxygen can be supplied to the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or more, 2 times or more, 3 times or more, 3.5 times or more, or 4 times or more the atomic proportion of M can be favorably used.

It is particularly preferable that the atomic ratio of In, M, and Zn in the semiconductor layer 108 be In:M:Zn=5:1:6 or in the neighborhood thereof (including the case where when In is 5, M is greater than or equal to 0.5 and less than or equal to 1.5 and Zn is greater than or equal to 5 and less than 7). Alternatively, the atomic ratio of In, M, and Zn is preferably In:M:Zn=4:2:3 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the above transistor with high field-effect mobility in a gate driver that generates a gate signal, a display device with a small frame width (also referred to as a narrow frame) can be provided. Furthermore, with the use of the above transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility may sometimes be low if the semiconductor layer 108 has high crystallinity. The crystallinity of the semiconductor layer 108 can be analyzed by X-ray diffraction (XRD) or a transmission electron microscope (TEM), for example.

Here, impurities such as hydrogen or moisture entering the semiconductor layer 108 adversely affect the transistor characteristics and therefore cause a problem. Thus, the amount of impurities such as hydrogen or moisture in the semiconductor layer 108 is preferably as small as possible. It is preferable to use a metal oxide film having a low impurity concentration and a low density of defect states, in which case a transistor having excellent electrical characteristics can be fabricated. By reducing the impurity concentration and reducing the density of defect states (reducing oxygen vacancies), the carrier density in the film can be reduced. A transistor including such a metal oxide film as a semiconductor layer rarely has electrical characteristics with a negative threshold voltage (also referred to as normally-on). Furthermore, a transistor including such a metal oxide film can have characteristics of an extremely low off-state current.

The semiconductor layer 108 may have a stacked structure including two or more layers.

For example, the semiconductor layer 108 in which two or more metal oxide films with different compositions are stacked can be used. For instance, in the case of using an In—Ga—Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

Alternatively, the semiconductor layer 108 in which two or more metal oxide films with different crystallinities are stacked can be used. In this case, the metal oxide films are preferably successively formed without exposure to the atmospheric air by using the same oxide target and different deposition conditions.

For example, the oxygen flow rate ratio at the time of forming an earlier-formed first metal oxide film is set smaller than that at the time of forming a subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, owing to the second metal oxide film as the upper film having higher crystallinity than the first metal oxide film, damage caused at the time of processing the semiconductor layer 108 or depositing the insulating layer 110 can be reduced.

Specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the film formation, such as pressure, temperature, and power, may vary between the first metal oxide film and the second metal oxide film, it is preferable to employ the same conditions other than the oxygen flow rate ratio, in which case the time required for the film formation steps can be shortened.

With such a structure, the transistor 100 with excellent electrical characteristics and high reliability can be achieved.

The above is the description of Structure example 1.

Structure Example 2

A transistor structure example that is partly different from Structure example 1 shown above will be described below. Note that description of the same portions as those in Structure example 1 shown above is omitted below in some cases. Furthermore, in drawings that are referred to later, the same hatching pattern is applied to portions having functions similar to those in the above structure example, and the portions are not denoted by reference numerals in some cases.

Figure 2A:
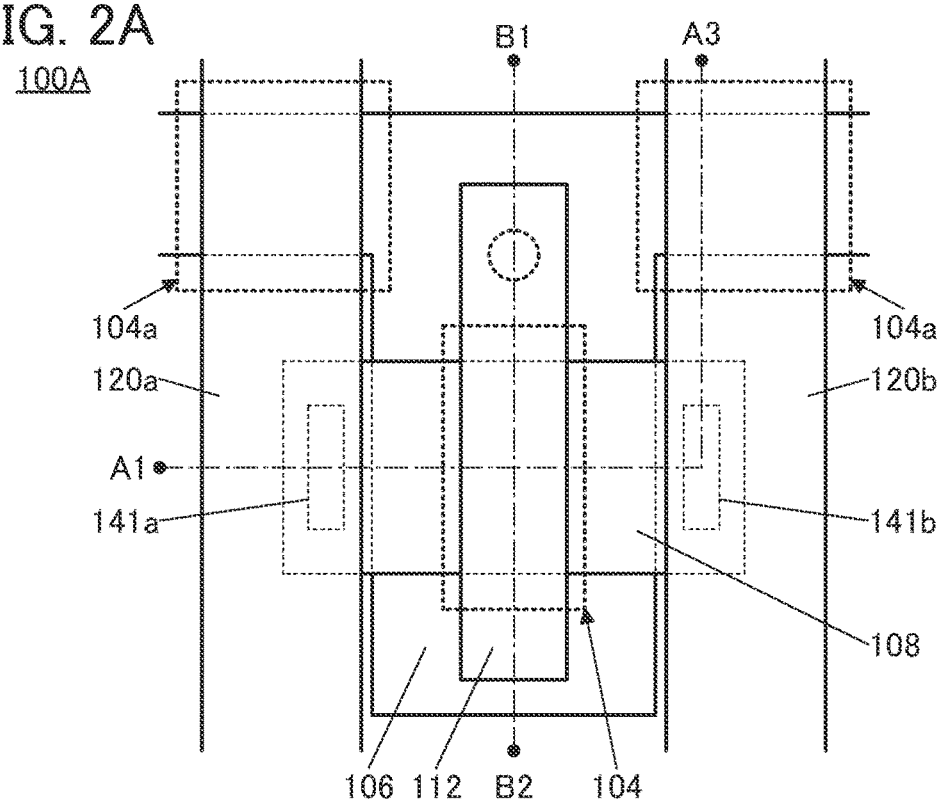
FIGS. 2A to 2C A structure example of a transistor.
Figure 2B:
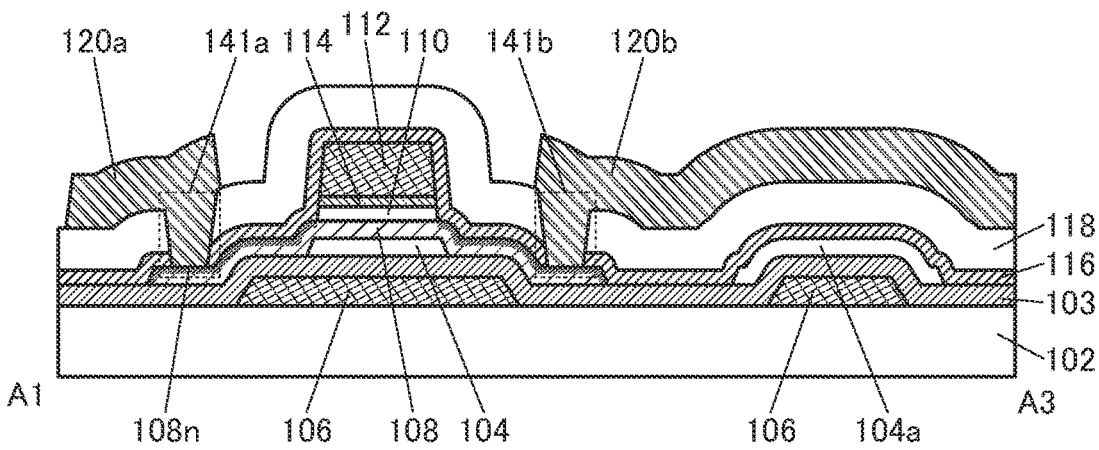
Figure 2C:
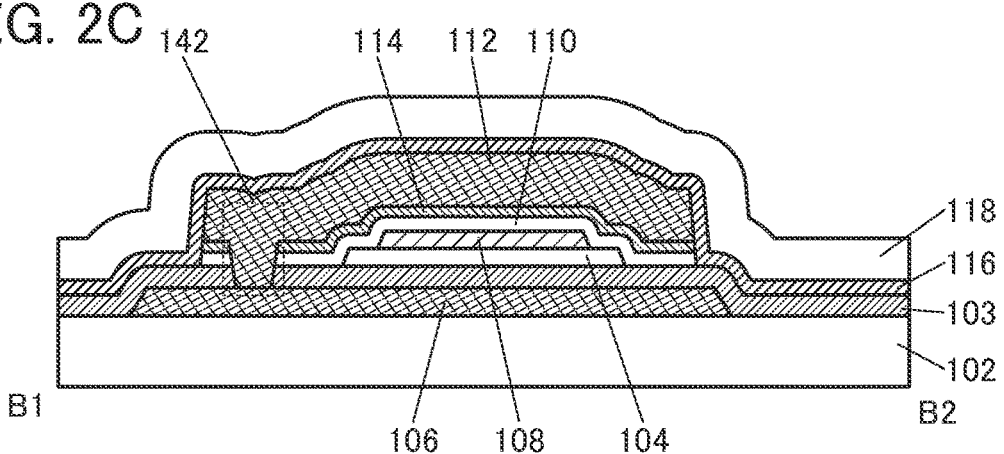

FIG. 2(A) is a top view of the transistor 100A, FIG. 2(B) is a cross-sectional view including the channel length direction of the transistor 100A, and FIG. 2(C) is a cross-sectional view of the transistor 100A in the channel width direction.

The transistor 100A is different from Structure example 1 mainly in including a conductive layer 106 between the substrate 102 and the insulating layer 103. The conductive layer 106 includes a region overlapped by the semiconductor layer 108 and the conductive layer 112 with the insulating layer 104 and the insulating layer 103 therebetween.

In the transistor 100A, the conductive layer 106 has a function of a first gate electrode (also referred to as a bottom gate electrode), and the conductive layer 112 has a function of a second gate electrode (also referred to as a top gate electrode). Part of the insulating layer 103 and part of the insulating layer 104 function as a first gate insulating layer, and part of the insulating layer 110 functions as a second gate insulating layer.

A portion of the semiconductor layer 108 that overlaps at least one of the conductive layer 112 and the conductive layer 106 functions as a channel formation region. Note that for simplification of the following description, a portion of the semiconductor layer 108 that is overlapped by the conductive layer 112 will be sometimes referred to as a channel formation region; however, a channel can be actually formed also in a portion that is not overlapped by the conductive layer 112 and overlaps the conductive layer 106 (a portion including the region 108n).

As illustrated in FIG. 2(C), the conductive layer 106 may be electrically connected to the conductive layer 112 through an opening 142 provided in the metal oxide layer 114, the insulating layer 110, and the insulating layer 103. Thus, the same potential can be supplied to the conductive layer 106 and the conductive layer 112.

For the conductive layer 106, a material similar to that for the conductive layer 112, the conductive layer 120a, or the conductive layer 120b can be used. Specifically, a material containing copper is preferably used for the conductive layer 106, in which case wiring resistance can be reduced.

As illustrated in FIGS. 2(A) and 2(C), the conductive layer 112 and the conductive layer 106 preferably extend beyond an end portion of the semiconductor layer 108 in the channel width direction. In that case, as illustrated in FIG. 2(C), the semiconductor layer 108 in the channel width direction is entirely surrounded by the conductive layer 112 and the conductive layer 106 with the insulating layer 110 and the insulating layer 104 therebetween.

With such a structure, the semiconductor layer 108 can be electrically surrounded by electric fields generated by a pair of gate electrodes. At this time, it is particularly preferable that the same potential be supplied to the conductive layer 106 and the conductive layer 112. Accordingly, electric fields for inducing a channel can be effectively applied to the semiconductor layer 108, whereby the on-state current of the transistor 100A can be increased. Thus, miniaturization of the transistor 100A is possible.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other. In this case, the potential supplied to one of the electrodes can control the threshold voltage at the time of driving the transistor 100A with the other electrode.

The transistor 100A in which the insulating layer 104 is provided on the inner side compared to the conductive layer 106 is shown as an example. That is, processing is performed so that the end portions of the insulating layer 104 are positioned on the inner side compared to the end portions of the conductive layer 106 in the channel length direction of the transistor 100A, and the end portions of the insulating layer 104 are positioned on the inner side compared to the end portions of the conductive layer 106 also in the channel width direction.

As illustrated in FIG. 2(A), an insulating layer 104a is provided at the intersection of the conductive layer 106 and the conductive layer 120a and at the intersection of the conductive layer 106 and the conductive layer 120b.

FIG. 2(B) illustrates the intersection of the conductive layer 120b and the conductive layer 106. The insulating layer 104a is an insulating layer that is positioned on the same surface as the insulating layer 104 and contains the same material as the insulating layer 104. For example, the insulating layer 104a can be formed by processing the same insulating film as the insulating layer 104. When the insulating layer 104a is positioned in a portion where the conductive layer 120b and the conductive layer 106 intersect with each other, the parasitic capacitance between the conductive layer 120b and the conductive layer 106 can be reduced.

Note that although an example in which the insulating layer 104a is arranged at the intersection of the conductive layer 106 and the conductive layer 120a or the conductive layer 120b is described here, the arrangement is not limited thereto. Parasitic capacitance can be reduced in a manner similar to the above, for example, when the insulating layer 104a is arranged at the intersection of the conductive layer 112 (or a wiring obtained by processing the same conductive film as the conductive layer 112), a wiring obtained by processing the same semiconductor film as the semiconductor layer 108, or the like and the conductive layer 106.

The above is the description of Structure example 2.

VARIATION EXAMPLES

Variation examples of Structure example 2 will be described below.

Variation Example 1

Figure 3A:
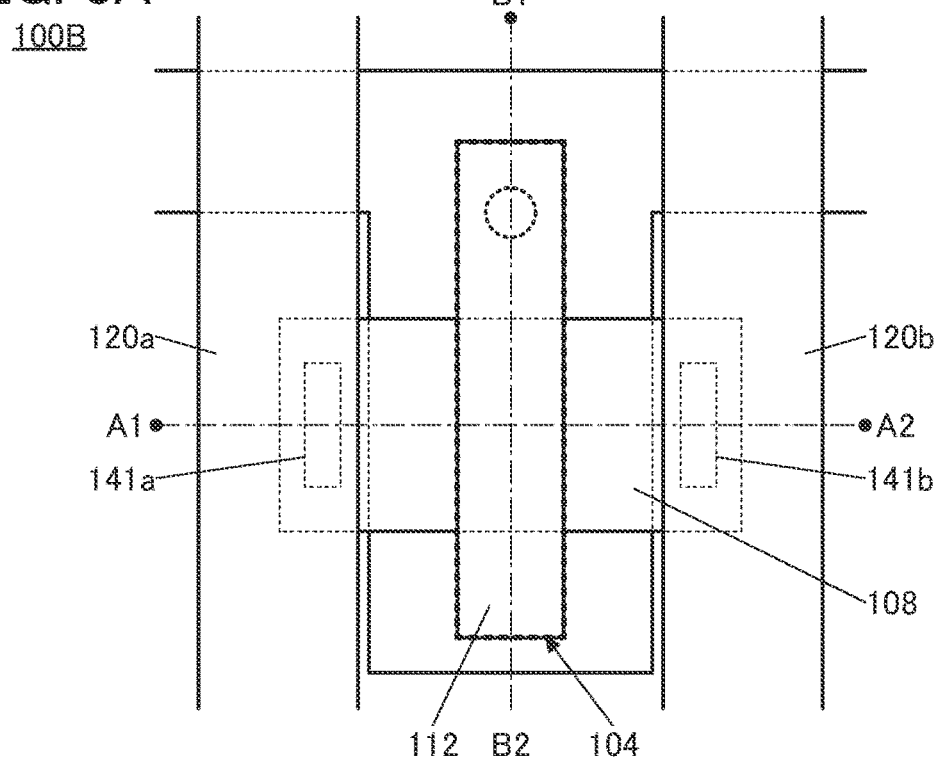
FIGS. 3A to 3C A structure example of a transistor.
Figure 3B:
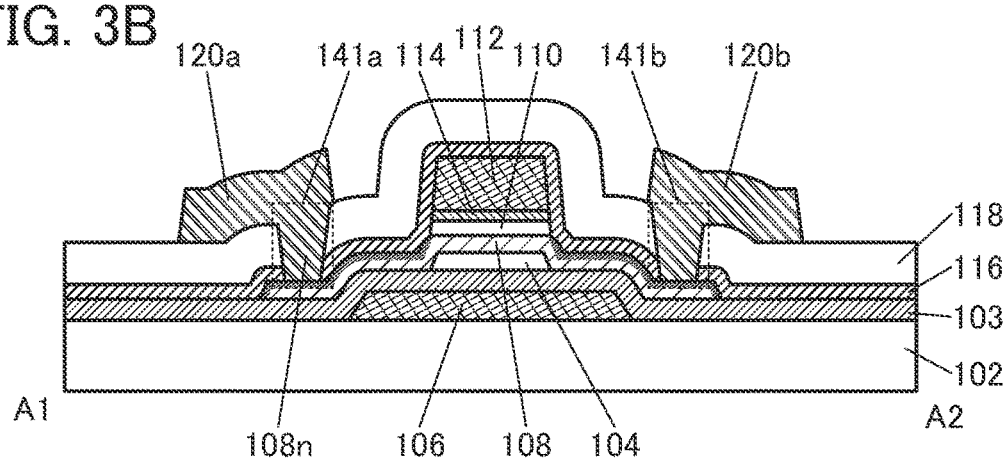
Figure 3C:
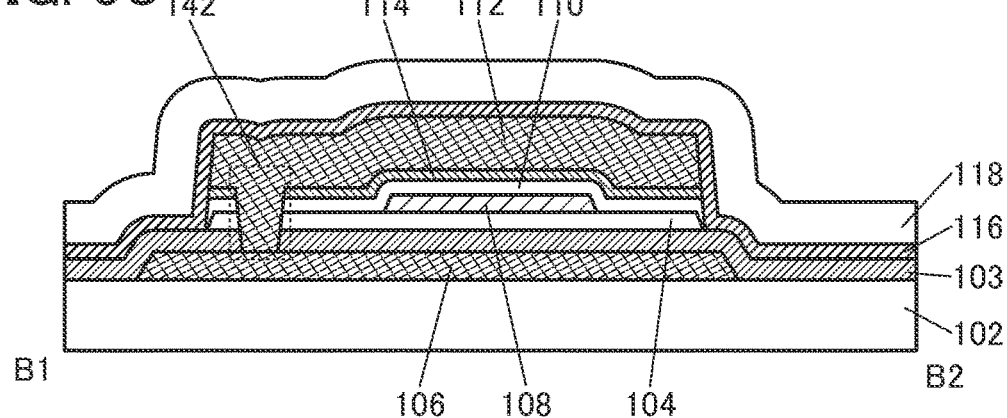

A transistor 100B illustrated in FIGS. 3(A), 3(B), and 3(C) is an example in which the insulating layer 104 is processed using the same photomask as that for the conductive layer 112.

The outlines of the insulating layer 104 and the conductive layer 112 substantially match in the plan view. Note that depending on the processing conditions of the insulating layer 104 and the conductive layer 112, the outline of the insulating layer 104 may be located on the inner side or the outer side compared to the outline of the conductive layer 112.

Using the same photomask to process the insulating layer 104 and the conductive layer 112 as in this example can reduce the manufacturing cost.

Note that although the case where the conductive layer 112 has an island shape and part of the conductive layer 106 functions as a wiring is described here, it is also possible to employ a layout pattern in which the conductive layer 106 has an island shape and part of the conductive layer 112 is used as a wiring. In that case, the insulating layer 104 is processed using the same photomask as that for the conductive layer 106.

Variation Example 2

Figure 4A:
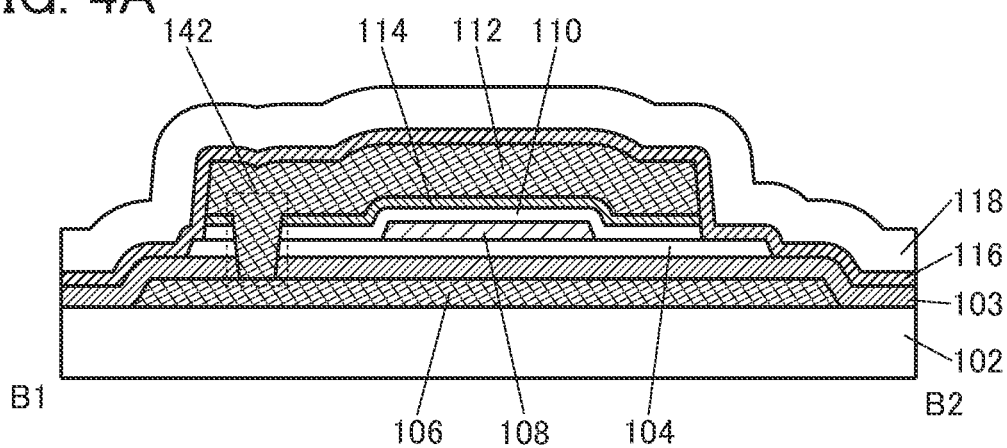
FIGS. 4A to 4C Structure examples of a transistor.

A cross section in the channel width direction illustrated in FIG. 4(A) is different from that in FIG. 2(C) mainly in the length of the insulating layer 104 in the channel width direction.

FIG. 4(A) illustrates the case where end portions of the insulating layer 104 in the channel width direction are positioned on the outer side compared to end portions of the conductive layer 112 in the channel width direction and are positioned on the inner side compared to end portions of the conductive layer 106 in the channel width direction.

Moreover, the conductive layer 112 and the conductive layer 106 are electrically connected to each other through the opening 142 provided in the metal oxide layer 114, the insulating layer 110, the insulating layer 104, and the insulating layer 103.

Variation Example 3

Figure 4B:
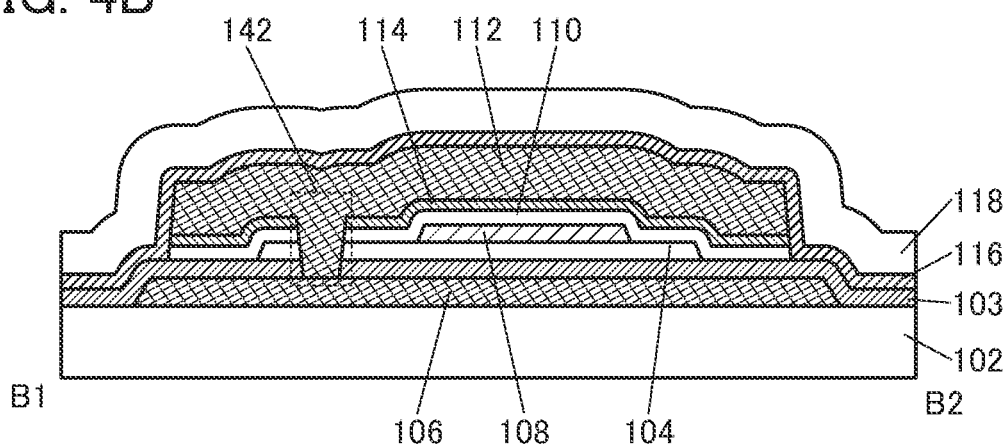

FIG. 4(B) illustrates an example in which end portions of the insulating layer 104 in the channel width direction are positioned on the inner side compared to end portions of the conductive layer 112 in the channel width direction and end portions of the conductive layer 106 in the channel width direction, and the insulating layer 104 is provided in a portion where the opening 142 is provided.

Variation Example 4

Figure 4C:
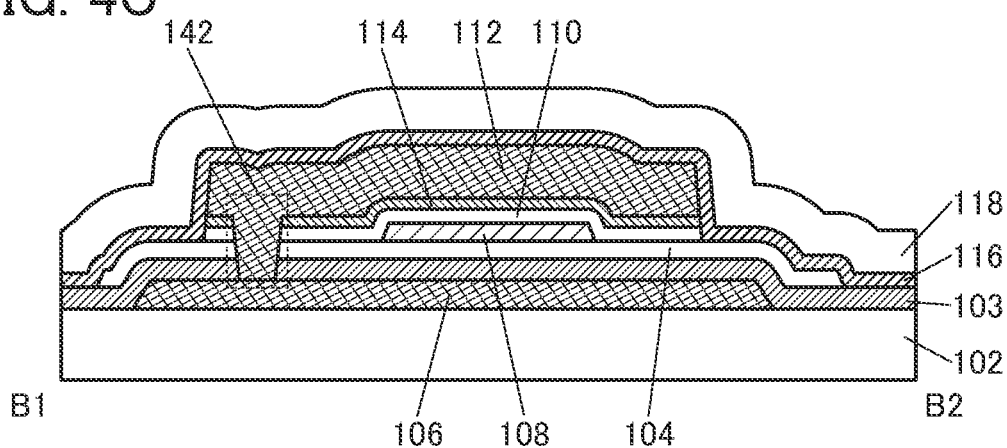

FIG. 4(C) illustrates an example in which end portions of the insulating layer 104 in the channel width direction are positioned on the outer side compared to end portions of the conductive layer 112 in the channel width direction and end portions of the conductive layer 106 in the channel width direction.

The above is the description of the variation examples.

Application Example

An example of the case where the above-described transistor is used in a pixel of a display device will be described below.

Figure 5:
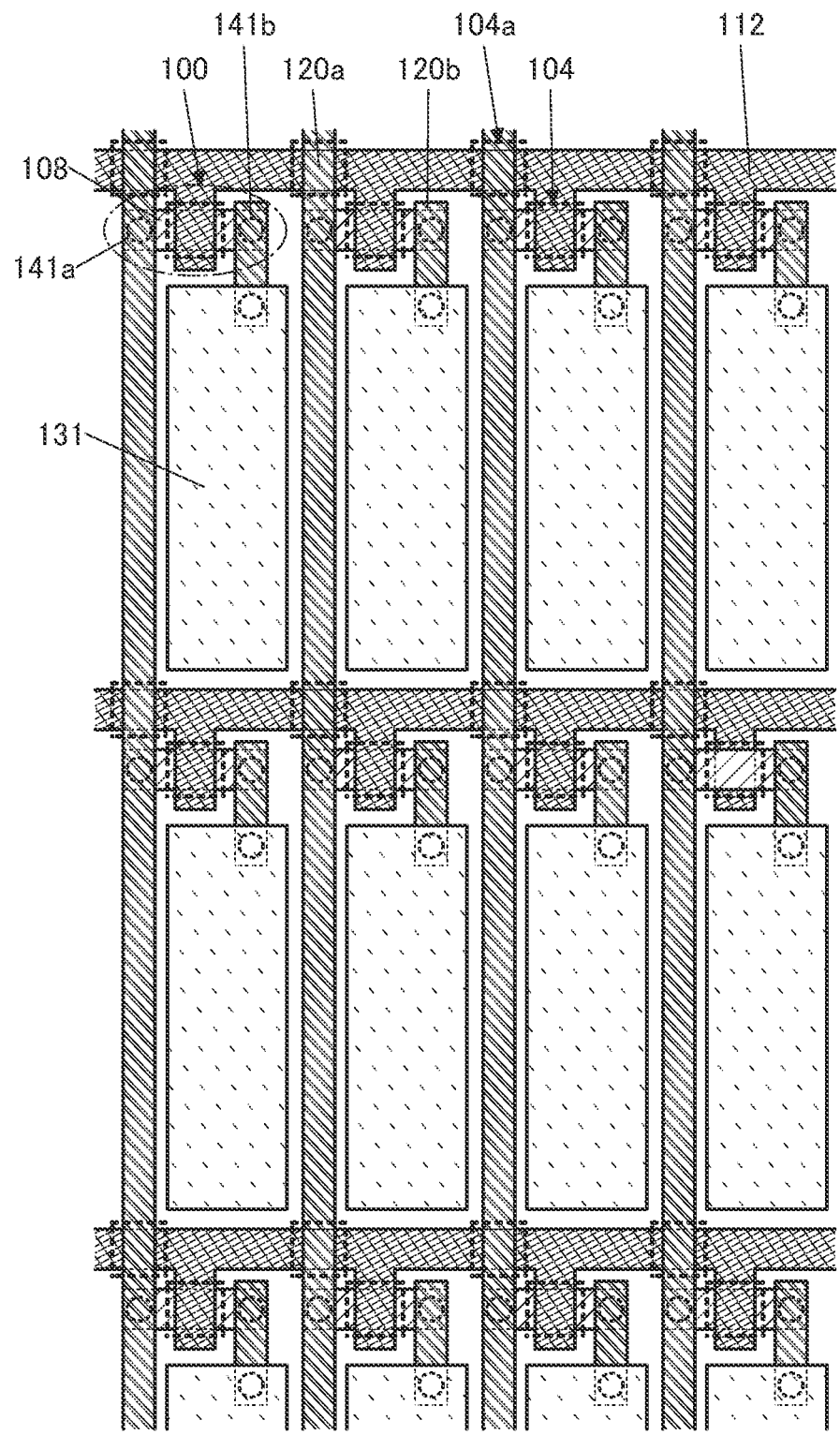
FIG. 5 A structure example of a pixel.

FIG. 5 is a schematic top view of a display device in which a plurality of subpixels are arranged in a matrix. One subpixel includes at least one transistor 100 and a conductive layer 131 that functions as a pixel electrode electrically connected to the transistor 100. Although a simplified structure of the subpixel is illustrated here, another transistor, a capacitor, or the like can be provided as appropriate depending on a display element used in the subpixel.

In FIG. 5, the conductive layer 112 functions as a gate line (also referred to as a scan line), the conductive layer 120a functions as a source line (also referred to as a signal line or a video signal line), and the conductive layer 120b functions as a wiring that electrically connects the transistor 100 and the conductive layer 131.

In FIG. 5, one island-shaped insulating layer 104 is provided for each transistor. The insulating layer 104 is positioned so as to underlie the channel formation region of the semiconductor layer 108 of the transistor 100, and is provided so as not to be positioned in connection portions of the conductive layers 120a and 120b and the semiconductor layer 108 (the opening 141a and the opening 141b).

Moreover, in FIG. 5, the insulating layer 104a is provided at the intersection of the conductive layer 112 and the conductive layer 120a.

The transistor of one embodiment of the present invention can be used in not only a display device but also a variety of circuits and devices. For example, the transistor of one embodiment of the present invention can be favorably used in a variety of circuits such as an arithmetic circuit, a memory circuit, a driver circuit, and an interface circuit in an IC chip mounted on an electronic device or the like, a driver circuit in a display device including a liquid crystal element, an organic EL element, or the like or a variety of sensor devices, or the like.

The above is the description of the application example.

[Components of Semiconductor Device]

Next, components included in the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 104]

The insulating layer 104 can be formed by a sputtering method, a CVD method, an evaporation method, a pulsed laser deposition (PLD) method, or the like as appropriate. For example, the insulating layer 104 can be formed of a single layer or a stacked layer of an oxide insulating film or a nitride insulating film. To improve the properties of the interface with the semiconductor layer 108, at least a region in the insulating layer 104 that is in contact with the semiconductor layer 108 is preferably formed of an oxide insulating film. Moreover, a film from which oxygen is released by heating is preferably used as the insulating layer 104.

For example, a single layer or a stacked layer using silicon oxide, silicon oxynitride, silicon nitride oxide, silicon nitride, aluminum oxide, hafnium oxide, gallium oxide, Ga—Zn oxide, or the like can be provided as the insulating layer 104.

In the case where a film other than an oxide film, such as a silicon nitride film, is used for the side of the insulating layer 104 that is in contact with the semiconductor layer 108, pretreatment such as oxygen plasma treatment is preferably performed on a surface in contact with the semiconductor layer 108 to oxidize the surface or the vicinity of the surface.

[Conductive Film]

The conductive layer 112 and the conductive layer 106 each of which function as a gate electrode, the conductive layer 120a functioning as a source electrode, and the conductive layer 120b functioning as a drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the conductive layer 112, the conductive layer 106, the conductive layer 120a, and the conductive layer 120b, an oxide conductor or a metal oxide film such as In—Sn oxide, In—W oxide, In—W—Zn oxide, In—Ti oxide, In—Ti—Sn oxide, In—Zn oxide, In—Sn—Si oxide, or In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 112 or the like may have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film in contact with the insulating layer functioning as a gate insulating film.

Among the above-mentioned metal elements, it is particularly preferable that any one or more metal elements selected from titanium, tungsten, tantalum, and molybdenum be included in the conductive layer 112, the conductive layer 106, the conductive layer 120a, and the conductive layer 120b. It is particularly preferable that a tantalum nitride film be used. Since the tantalum nitride film has conductivity and a high barrier property against copper, oxygen, or hydrogen and releases little hydrogen from itself, it can be favorably used as the conductive film in contact with the semiconductor layer 108 or the conductive film in the vicinity of the semiconductor layer 108.

[Insulating Layer 110]

The insulating layer 110 functioning as a gate insulating film of the transistor 100 or the like can be formed by a PECVD method, a sputtering method, or the like. As the insulating layer 110, an insulating layer including one or more of the following films can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating layer 110 may have a stacked-layer structure of two layers or a stacked-layer structure of three or more layers.

The insulating layer 110, which is in contact with the semiconductor layer 108, is preferably an oxide insulating film and more preferably includes a region containing oxygen in excess of that in the stoichiometric composition. In other words, the insulating layer 110 is an insulating film capable of releasing oxygen. It is also possible to supply oxygen to the insulating layer 110, for example, by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere.

For the insulating layer 110, a material having a larger dielectric constant than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher dielectric constant than amorphous hafnium oxide.

[Semiconductor Layer]

In the case where the semiconductor layer 108 is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, which facilitates formation of the semiconductor layer 108 having crystallinity. Note that the atomic ratio in the semiconductor layer 108 to be formed may vary in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the formed semiconductor layer 108 is sometimes in the neighborhood of In:Ga:Zn=4:2:3 [atomic ratio].

Note that when the atomic ratio is described as In:Ga:Zn=4:2:3 or in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 108 is 2 eV or more, preferably 2.5 eV or more. With the use of such a metal oxide having a wider energy gap than silicon, the off-state current of the transistor can be reduced.

Furthermore, the semiconductor layer 108 preferably has a non-single-crystal structure. The non-single-crystal structure includes, for example, a CAAC structure which will be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. On the other hand, a clear grain boundary cannot be observed in the CAAC-OS; thus, it can be said that a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

An example of a crystal structure of a metal oxide is described. Note that a metal oxide deposited by a sputtering method using an In—Ga—Zn oxide target (In:Ga:Zn=4:2:4.1 [atomic ratio]) is described below as an example. A metal oxide that is deposited by a sputtering method using the above target at a substrate temperature higher than or equal to 100° C. and lower than or equal to 130° C. is likely to have either the nc (nano crystal) structure or the CAAC structure, or a structure in which both structures are mixed. In contrast, a metal oxide formed by a sputtering method at a substrate temperature set at room temperature (R.T.) is likely to have the nc structure. Note that room temperature (R.T.) here also includes a temperature in the case where a substrate is not heated intentionally.

Manufacturing Method Example

An example of a method for manufacturing a transistor of one embodiment of the present invention will be described below. Here, the description will be made giving, as an example, the transistor 100A described in Structure example 2.

Note that thin films that form the semiconductor device (insulating films, semiconductor films, conductive films, and the like) can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by a method such as spin coating, dipping, spray coating, ink jetting, dispensing, screen printing, offset printing, a doctor knife, slit coating, roll coating, curtain coating, or knife coating.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, and the thin film is processed by etching or the like, so that the resist mask is removed. In the other method, after a photosensitive thin film is formed, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion light exposure technique. Furthermore, as the light used for the exposure, extreme ultra-violet (EUV) light or X-rays may be used. Instead of the light used for the exposure, an electron beam can also be used. It is preferable to use extreme ultra-violet light, X-rays, or an electron beam because extremely minute processing is possible. Note that in the case of performing exposure by scanning of a beam such as an electron beam, a photomask is not needed.

For etching of the thin film, a dry etching method, a wet etching method, a sandblast method, or the like can be used.

Each diagram illustrated in FIG. 6 to FIG. 8 shows cross sections in the channel length direction and the channel width direction, side by side, of the transistor 100A at each stage in the manufacturing process.

[Formation of Conductive Layer 106]

Figure 6A:
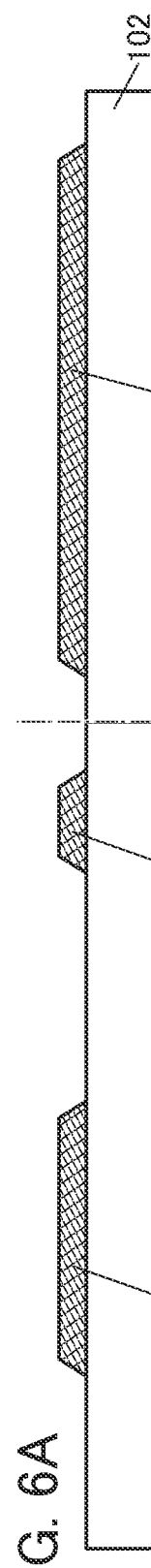
FIGS. 6A to 6C Diagrams illustrating a method for manufacturing a transistor.

A conductive film is deposited over the substrate 102 and processed by etching, whereby the conductive layer 106 functioning as a gate electrode is formed (FIG. 6(A)).

[Formation of Insulating Layer 103 and Insulating Layer 104]

Figure 6B:
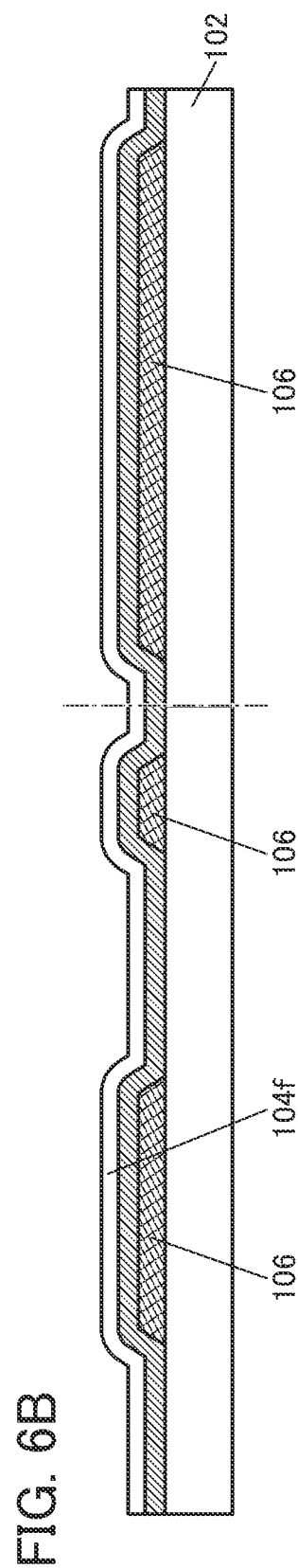

Next, a stack of the insulating layer 103 and an insulating film 104f is formed to cover the substrate 102 and the conductive layer 106 (FIG. 6(B)). The insulating layer 103 and the insulating film 104f can each be formed by a PECVD method, an ALD method, a sputtering method, or the like.

For example, the insulating layer 103 can be formed by an ALD method, a PECVD method, or sputtering, and the insulating film 104f can be formed by a PECVD method or a sputtering method.

Figure 6C:
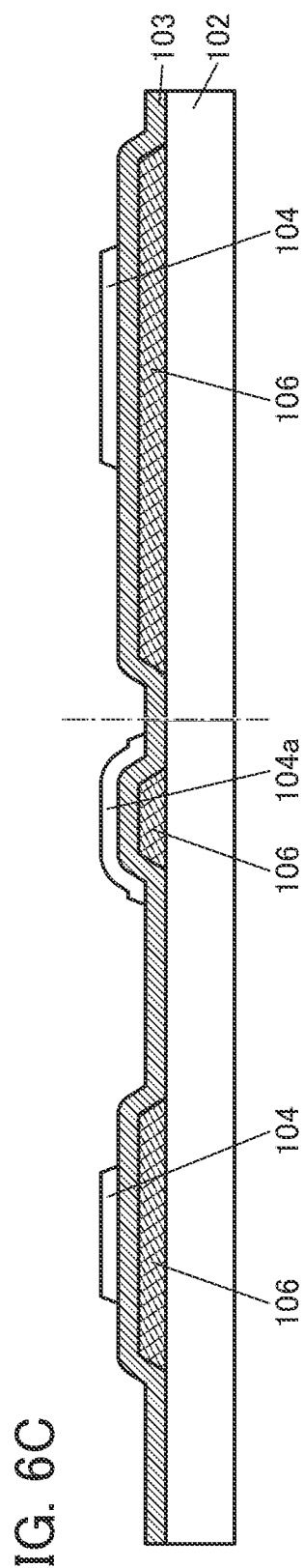

Next, the insulating film 104f is partly removed and processed into an island shape by etching, whereby the insulating layer 104 and the insulating layer 104a are formed (FIG. 6(C)).

[Formation of Semiconductor Layer 108]

Figure 7A:
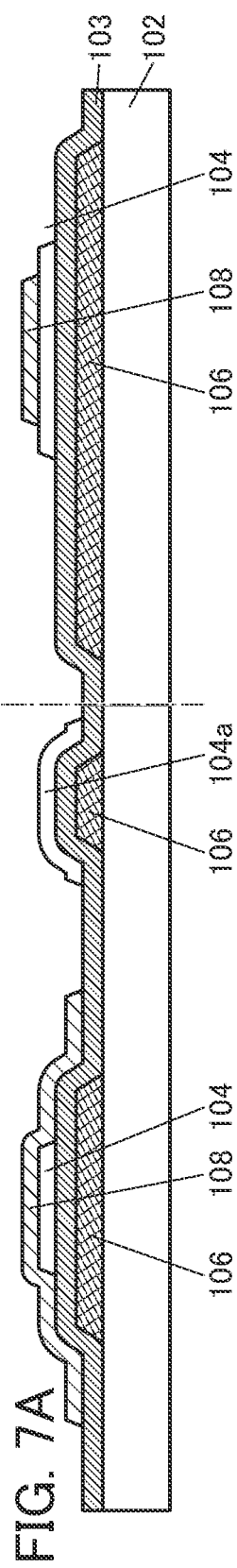
FIGS. 7A to 7C Diagrams illustrating a method for manufacturing a transistor.

Next, a metal oxide film is deposited over the insulating layer 104 and the insulating layer 103 and processed to form the semiconductor layer 108 (FIG. 7(A)).

The metal oxide film is preferably formed by a sputtering method using a metal oxide target.

In forming the metal oxide film, an inert gas (e.g., a helium gas, an argon gas, or a xenon gas) may be mixed in addition to an oxygen gas. Note that when the proportion of an oxygen gas in the whole deposition gas (hereinafter also referred to as oxygen flow rate ratio) at the time of forming the metal oxide film is higher, the crystallinity of the metal oxide film can be higher and a transistor with higher reliability can be obtained. On the other hand, when the oxygen flow rate ratio is lower, the crystallinity of the metal oxide film is lower and a transistor with a high on-state current can be obtained.

As deposition conditions of the metal oxide film, the substrate temperature is set higher than or equal to room temperature and lower than 200° C., preferably higher than or equal to room temperature and lower than or equal to 140° C. For example, when the deposition temperature is higher than or equal to room temperature and lower than 140° C., high productivity is achieved, which is preferable. When the metal oxide film is formed with the substrate temperature set at room temperature or without intentional heating, the crystallinity can be made low.

Before deposition of the metal oxide film, it is preferable to perform treatment for desorbing water, hydrogen, an organic substance, or the like adsorbed onto a surface of the insulating layer 104 or treatment for supplying oxygen into the insulating layer 104. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed in an $N_2O$ gas-containing atmosphere, an organic substance on the surface of the insulating layer 104 can be favorably removed. After such treatment, the metal oxide film is preferably deposited successively without exposure of the surface of the insulating layer 104 to the atmospheric air.

For processing of the metal oxide film, one or both of a wet etching method and a dry etching method can be used. At this time, part of the insulating layer 104 that is not overlapped by the semiconductor layer 108 is etched and thinned in some cases.

After the metal oxide film is deposited or processed into the semiconductor layer 108, heat treatment may be performed to remove hydrogen or water in the metal oxide film or the semiconductor layer 108. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in this atmosphere, and then heating may be performed in an oxygen-containing atmosphere. It is preferable that the atmosphere of the above heat treatment not contain hydrogen, water, or the like. An electric furnace, an RTA apparatus, or the like can be used for the heat treatment. The use of the RTA apparatus can shorten the heat treatment time.

[Formation of Insulating Film 110f and Metal Oxide Film 114f]

Next, to cover the insulating layer 103, the insulating layer 104, and the semiconductor layer 108, an insulating film 110f to be the insulating layer 110 and a metal oxide film 114f to be the metal oxide layer 114 are deposited to be stacked.

As the insulating film 110f, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating film 110f may be formed by a PECVD method using a microwave.

The metal oxide film 114f is preferably deposited in an oxygen-containing atmosphere, for example. It is particularly preferable that the metal oxide film 114f be formed by a sputtering method in an oxygen-containing atmosphere. Thus, oxygen can be supplied to the insulating film 110f at the time of depositing the metal oxide film 114f.

The above description can be referred to for the case where the metal oxide film 114f is formed by a sputtering method using an oxide target containing a metal oxide as in the case of the semiconductor layer 108.

For example, the metal oxide film 114f is preferably deposited by a reactive sputtering method with a metal target using oxygen as a deposition gas. When aluminum is used for the metal target, for example, an aluminum oxide film can be deposited.

At the time of depositing the metal oxide film 114f, a larger amount of oxygen can be supplied to the insulating film 110f with a higher proportion of the oxygen flow rate to the total flow rate of the deposition gas introduced into a deposition chamber of a deposition apparatus (a higher oxygen flow rate ratio), or with a higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide film 114f is formed by a sputtering method in an oxygen-containing atmosphere in the above manner, oxygen can be supplied to the insulating film 110f and release of oxygen from the insulating film 110f can be prevented during the deposition of the metal oxide film 114f. As a result, an extremely large amount of oxygen can be enclosed in the insulating film 110f. Moreover, a large amount of oxygen can be supplied to the semiconductor layer 108 by heat treatment performed later. Thus, the amount of oxygen vacancies in the semiconductor layer 108 can be reduced, leading to a highly reliable transistor.

Then, after the deposition of the metal oxide film 114f, the metal oxide film 114f, the insulating film 110f, (the insulating layer 104), and the insulating layer 103 are partly removed by etching to form an opening reaching the conductive layer 106. Accordingly, the conductive layer 112 to be formed later and the conductive layer 106 can be electrically connected to each other through the opening.

Figure 7B:
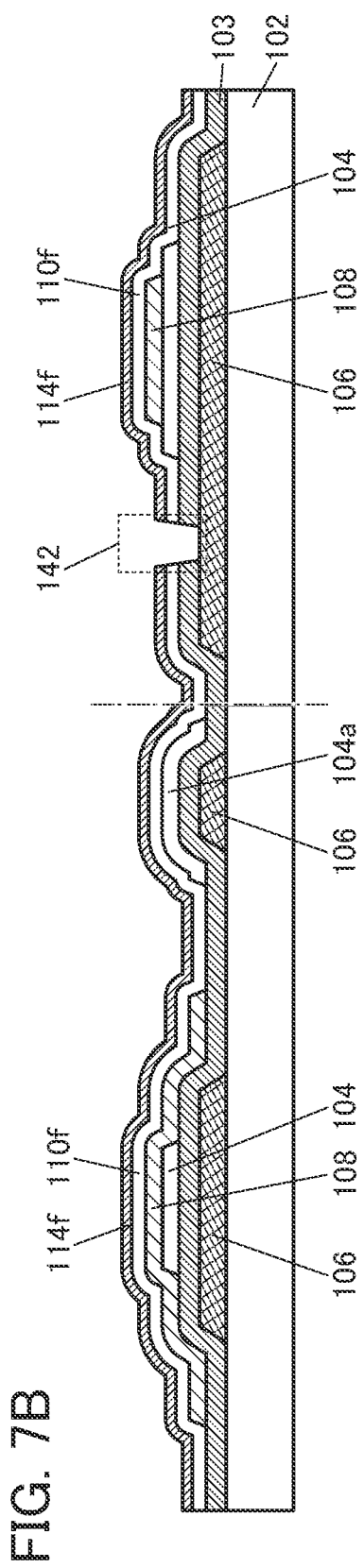

A schematic cross-sectional view at this stage corresponds to FIG. 7(B).

[Formation of Conductive Layer 112, Metal Oxide Layer 114, and Insulating Layer 110]

Next, a conductive film to be the conductive layer 112 is deposited over the metal oxide film 114f. The conductive film is preferably deposited by a sputtering method using a sputtering target of a metal or an alloy.

Figure 7C:
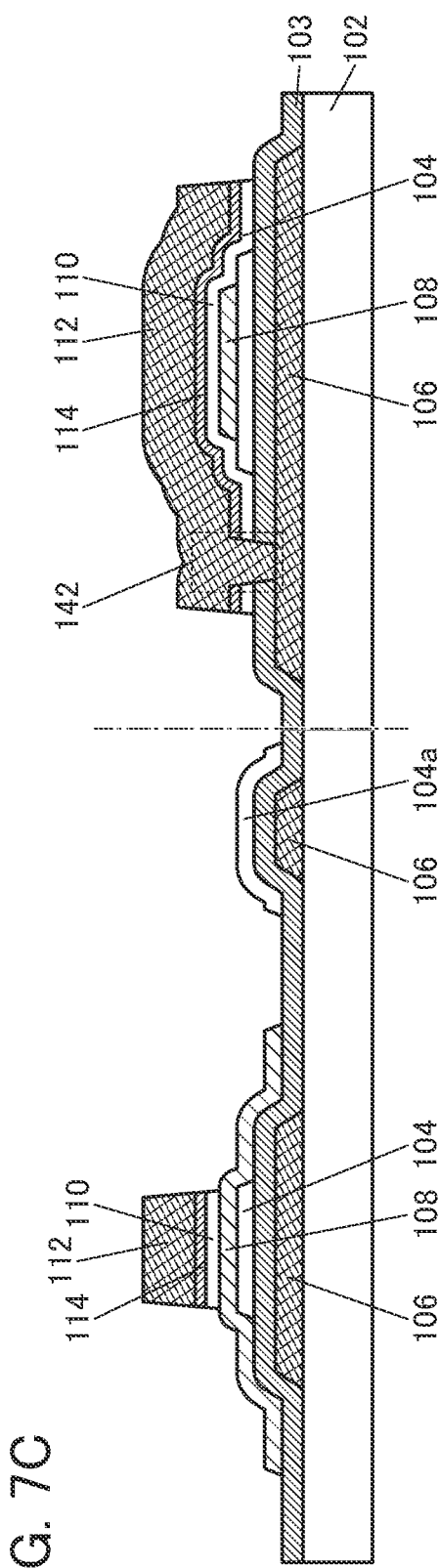

Next, the conductive film, the metal oxide film 114f, and the insulating film 110f are partly etched (FIG. 7(C)). The conductive film, the metal oxide film 114f, and the insulating film 110f are preferably processed using the same resist mask. Alternatively, the conductive layer 112 after etching may be used as a hard mask for etching of the metal oxide film 114f and the insulating film 110f.

In such a manner, the island-shaped conductive layer 112, metal oxide layer 114, and insulating layer 110 that have substantially the same top surface shapes can be formed.

Note that during etching of the conductive film, the metal oxide film 114f, and the insulating film 110f, the semiconductor layer 108 and the like that are not covered with the insulating layer 110 may sometimes be etched and reduced in thickness.

[Formation of Insulating Layer 116]

Next, the insulating layer 116 is formed to cover the insulating layer 104, the semiconductor layer 108, a side surface of the insulating layer 110, a side surface of the metal oxide layer 114, the conductive layer 112, and the like. At this time, a region where the insulating layer 103 and the insulating layer 116 are in contact with each other is formed on the outer side compared to end portions of the semiconductor layer 108 and the insulating layer 104 (FIG. 8(A)).

It is preferable to form the insulating layer 116 by a reactive sputtering method using a sputtering target containing the above-described metal element and, as a deposition gas, a mixed gas of a nitrogen gas and a rare gas or the like that is a dilution gas. Thus, the film quality of the insulating layer 116 can be easily controlled by controlling the flow rate ratio of the deposition gas.

For example, in the case where an aluminum nitride film formed by reactive sputtering using an aluminum target is used as the insulating layer 116, the flow rate of a nitrogen gas to the total flow rate of the deposition gas is preferably higher than or equal to 30% and lower than or equal to 100%, further preferably higher than or equal to 40% and lower than or equal to 100%, still further preferably higher than or equal to 50% and lower than or equal to 100%.

Alternatively, in the case where silicon nitride is used for the insulating layer 116, the insulating layer 116 may be formed by a PECVD method using a mixed gas of a gas containing silicon, such as silane, and a gas containing nitrogen, such as ammonia or dinitrogen monoxide, as a deposition gas. In this case, it is preferable that the deposited silicon nitride contain hydrogen. Thus, hydrogen in the insulating layer 116 is diffused into the semiconductor layer 108, whereby the resistance of part of the semiconductor layer 108 can be easily lowered.

At the time when the insulating layer 116 is deposited, the low-resistance region 108n is formed at the interface of the semiconductor layer 108 that is in contact with the insulating layer 116 and in a region in the vicinity of the interface.

[First Heat Treatment]

Next, heat treatment is preferably performed. The heat treatment can further promote the reduction in the resistance of the region 108n of the semiconductor layer 108.

The heat treatment is preferably performed in an inert gas atmosphere such as nitrogen or a rare gas. The temperature of the heat treatment is preferably as high as possible and can be set in consideration of the heat resistance of the substrate 102, the conductive layer 106, the conductive layer 112, and the like. The temperature can be set higher than or equal to 120° C. and lower than or equal to 500° C., preferably higher than or equal to 150° C. and lower than or equal to 450° C., further preferably higher than or equal to 200° C. and lower than or equal to 400° C., still further preferably higher than or equal to 250° C. and lower than or equal to 400° C., for example. When the temperature of the heat treatment is approximately 350° C., for example, the semiconductor device can be manufactured at a high yield with production facilities using a large-size glass substrate.

Note that the heat treatment may be performed at any stage after the formation of the insulating layer 116. In addition, this heat treatment may double as another heat treatment.

By the heat treatment, for example, oxygen in the semiconductor layer 108 is extracted to the insulating layer 116 side; thus, an oxygen vacancy is generated. When the oxygen vacancy is bonded to hydrogen contained in the semiconductor layer 108 or hydrogen supplied from the insulating layer 116, the carrier concentration may be increased, and the resistance of a portion in contact with the insulating layer 116 might be lowered.

Alternatively, when the metal element contained in the semiconductor layer 108 is diffused toward the vicinity of the interface between the semiconductor layer 108 and the insulating layer 116 by the heat treatment and a region having a high concentration of the metal element is formed, the resistance of the portion of the semiconductor layer 108 in contact with the insulating layer 116 is lowered in some cases. For example, in the case where a metal oxide film containing indium is used as the semiconductor layer 108, a region having a high indium concentration is sometimes observed in the vicinity of the interface between the semiconductor layer 108 and the insulating layer 116.

The region 108n, whose resistance has been lowered because of the above complex action, becomes a highly stable low-resistance region. The region 108n formed in the above manner is characterized in that the resistance is not easily increased again even if treatment for supplying oxygen is performed in a later step, for example.

[Formation of Insulating Layer 118]

Next, the insulating layer 118 is formed to cover the insulating layer 116. The insulating layer 118 can be formed, for example, by a PECVD method.

[Formation of Openings 141a and 141b]

Next, the insulating layer 118 and the insulating layer 116 are partly etched, whereby the opening 141a and the opening 141b that reach the regions 108n are formed.

[Formation of Conductive Layers 120a and 120b]

Next, a conductive film is deposited over the insulating layer 118 so as to cover the opening 141a and the opening 141b, and the conductive film is processed into a desired shape, whereby the conductive layer 120a and the conductive layer 120b are formed (FIG. 8(B)).

Through the above steps, the transistor 100A can be manufactured.

Note that in the case of manufacturing the transistor 100 shown in Structure example 1, the step of forming the conductive layer 106 and the step of forming the opening 142 in the above manufacturing method example are omitted.

The above is the description of the manufacturing method example.

At least part of the structure examples, the manufacturing method example, the drawings corresponding thereto, and the like exemplified in this embodiment can be implemented in combination with the other structure examples, the other manufacturing method examples, the other drawings, and the like as appropriate.

At least part of this embodiment can be implemented in combination with the other embodiments described in this specification as appropriate.

Embodiment 2

In this embodiment, an example of a display device that includes the transistor described in the foregoing embodiment will be described.

Structure Example

Figure 9A:
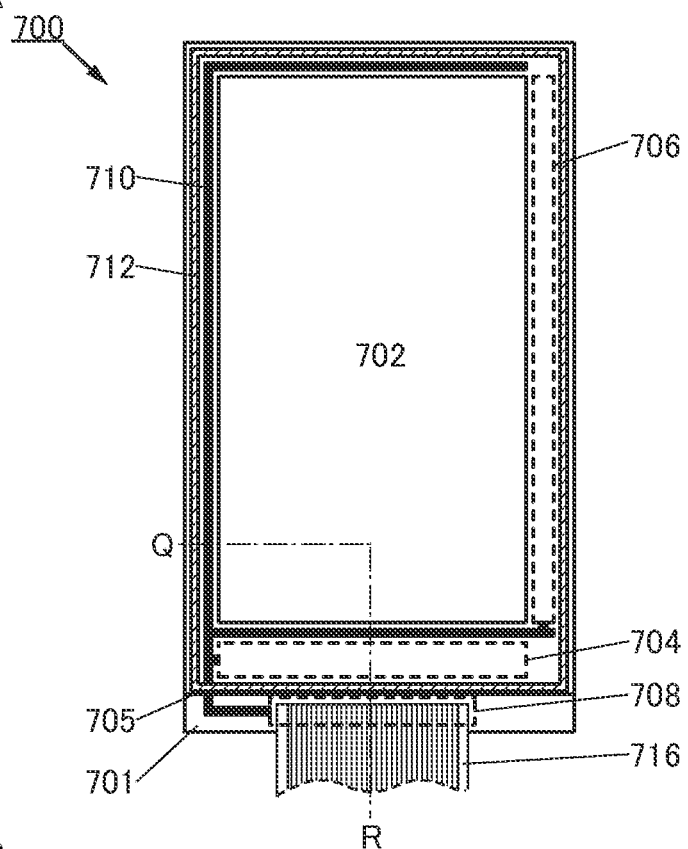

FIG. 9(A) is a top view of a display device 700. The display device 700 includes a first substrate 701 and a second substrate 705 that are bonded to each other with a sealant 712. Over the first substrate 701, a pixel portion 702, a source driver circuit portion 704, and a gate driver circuit portion 706 are provided in a region sealed with the first substrate 701, the second substrate 705, and the sealant 712. In the pixel portion 702, a plurality of display elements are provided.

A portion of the first substrate 701 that is not overlapped by the second substrate 705 is provided with an FPC terminal portion 708 to which an FPC 716 (Flexible printed circuit) is connected. The FPC 716 supplies a variety of signals and the like to the pixel portion 702, the source driver circuit portion 704, and the gate driver circuit portion 706 through the FPC terminal portion 708 and a signal line 710.

A plurality of gate driver circuit portions 706 may be provided. The gate driver circuit portion 706 and the source driver circuit portion 704 may each be in the form of an IC chip obtained by packaging a circuit portion formed separately on a semiconductor substrate or the like. The IC chip can be mounted over the first substrate 701 or on the FPC 716.

The transistor that is a semiconductor device of one embodiment of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. Examples of the light-emitting element include self-luminous light-emitting elements such as an LED (Light Emitting Diode), an OLED (Organic LED), a QLED (Quantum-dot LED), and a semiconductor laser. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 9B:
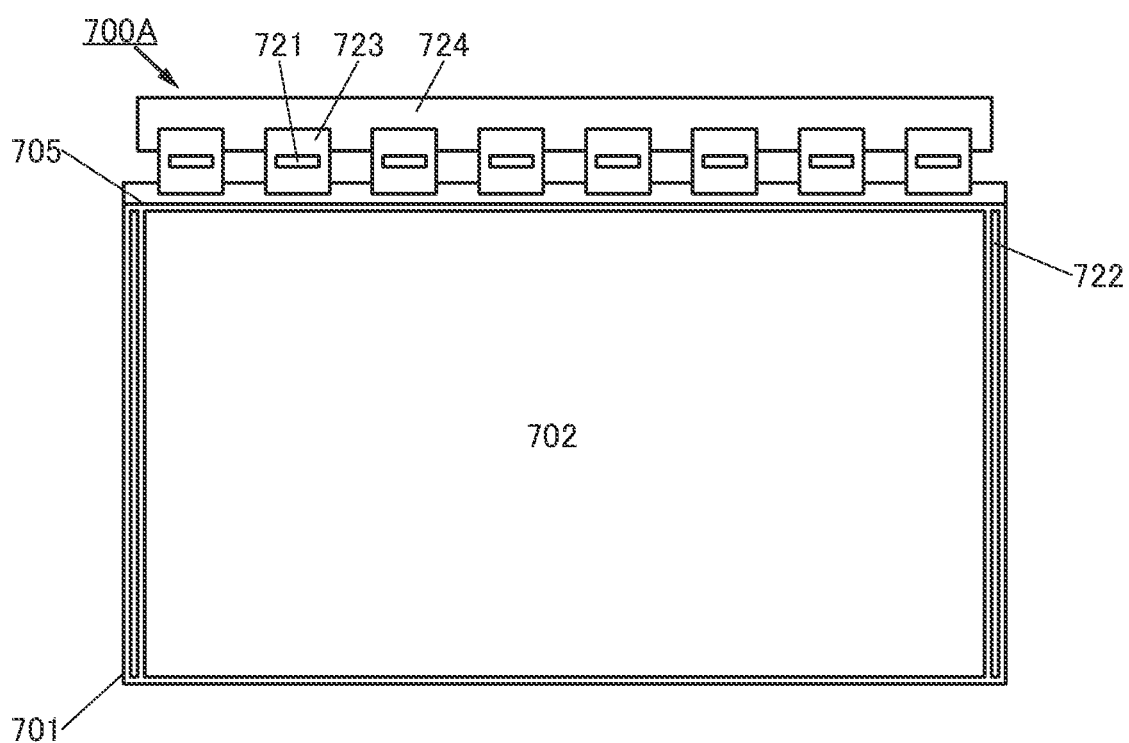

A display device 700A illustrated in FIG. 9(B) is a display device suitably used for an electronic device with a large screen. The display device 700A can be suitably used for a television device, a monitor device, a personal computer (including a laptop personal computer and a desktop personal computer), a tablet terminal, and digital signage, for example.

The display device 700A includes a plurality of source driver ICs 721 and a pair of gate driver circuit portions 722.

The plurality of source driver ICs 721 are attached to respective FPCs 723. One terminal of each of the plurality of FPCs 723 is connected to the first substrate 701, and the other terminal is connected to a printed circuit board 724. Bending the FPCs 723 allows the printed circuit board 724 to be placed on the rear side of the pixel portion 702 and mounted on an electronic device, resulting in space saving of the electronic device.

On the other hand, the gate driver circuit portions 722 are formed over the first substrate 701. Thus, an electronic device with a narrow frame can be achieved.

With such a structure, a large-size and high-resolution display device can be obtained. For example, such a structure can also be used for a display device whose screen diagonal is 30 inches or more, 40 inches or more, 50 inches or more, or 60 inches or more. Furthermore, a display device with extremely high resolution such as 4K2K or 8K4K can be obtained.

[Cross-Sectional Structure Example]

Structures including a liquid crystal element and an EL element as display elements will be described below with reference to FIG. 10 to FIG. 12. Note that FIG. 10 to FIG.

12 are cross-sectional views along the dashed-dotted line Q-R in FIG. 9(A). FIG. 10 and FIG. 11 each illustrate a structure including a liquid crystal element as a display element, and FIG. 12 illustrates a structure including an EL element.

[Description of Common Portions in Display Devices]

Figure 10:
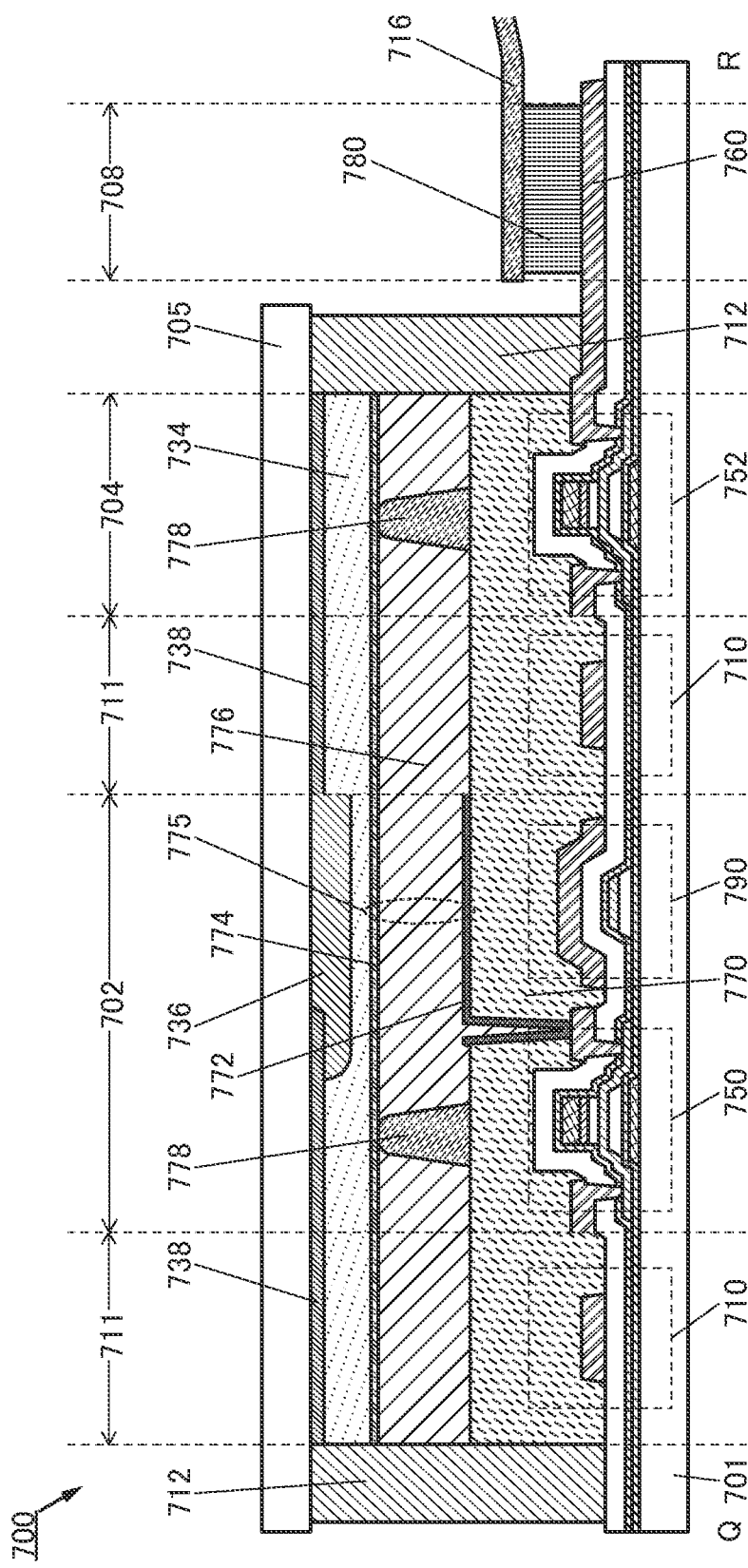
FIG. 10 A cross-sectional view of a display device.
Figure 11:
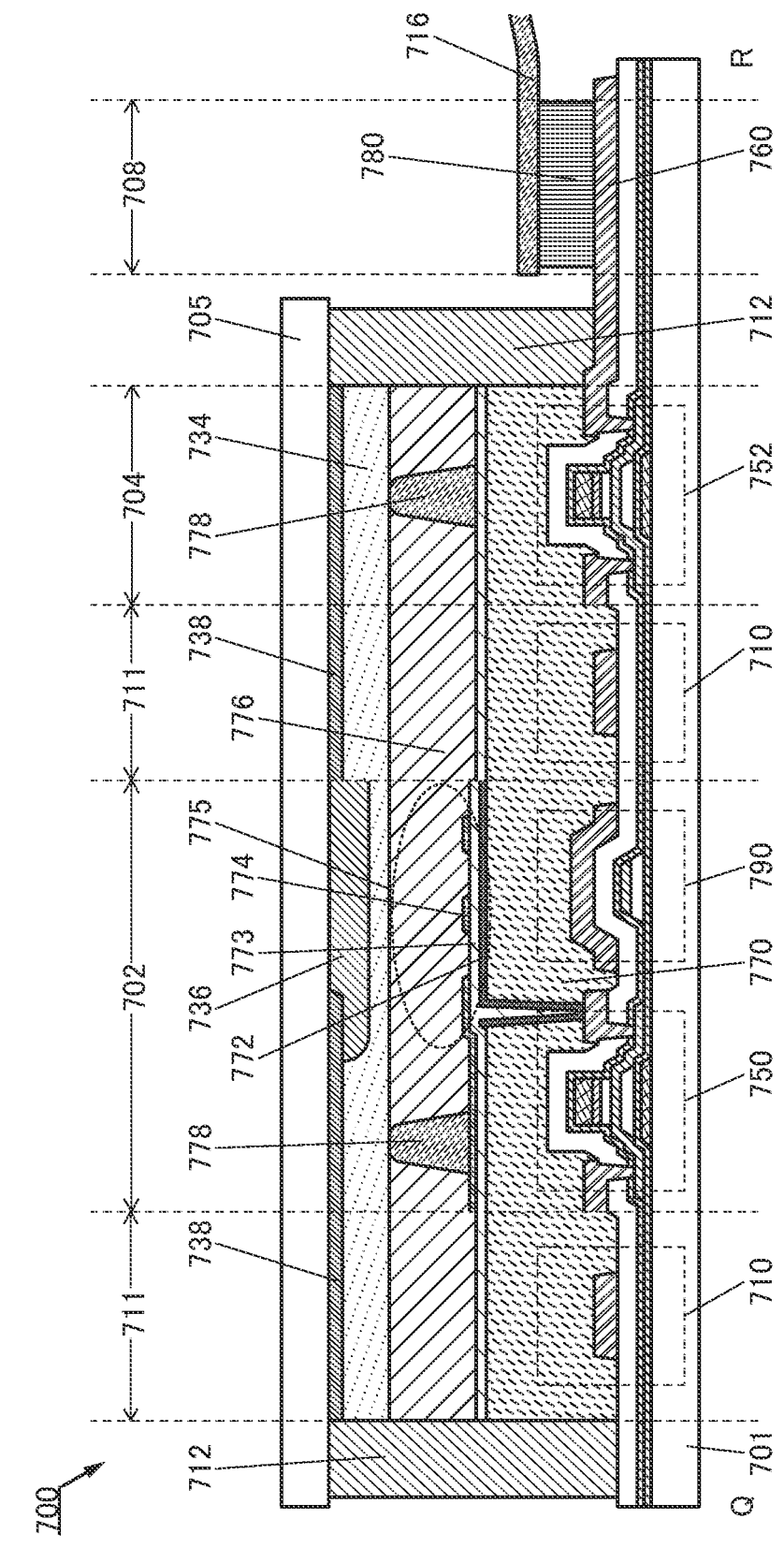
FIG. 11 A cross-sectional view of a display device.
Figure 12:
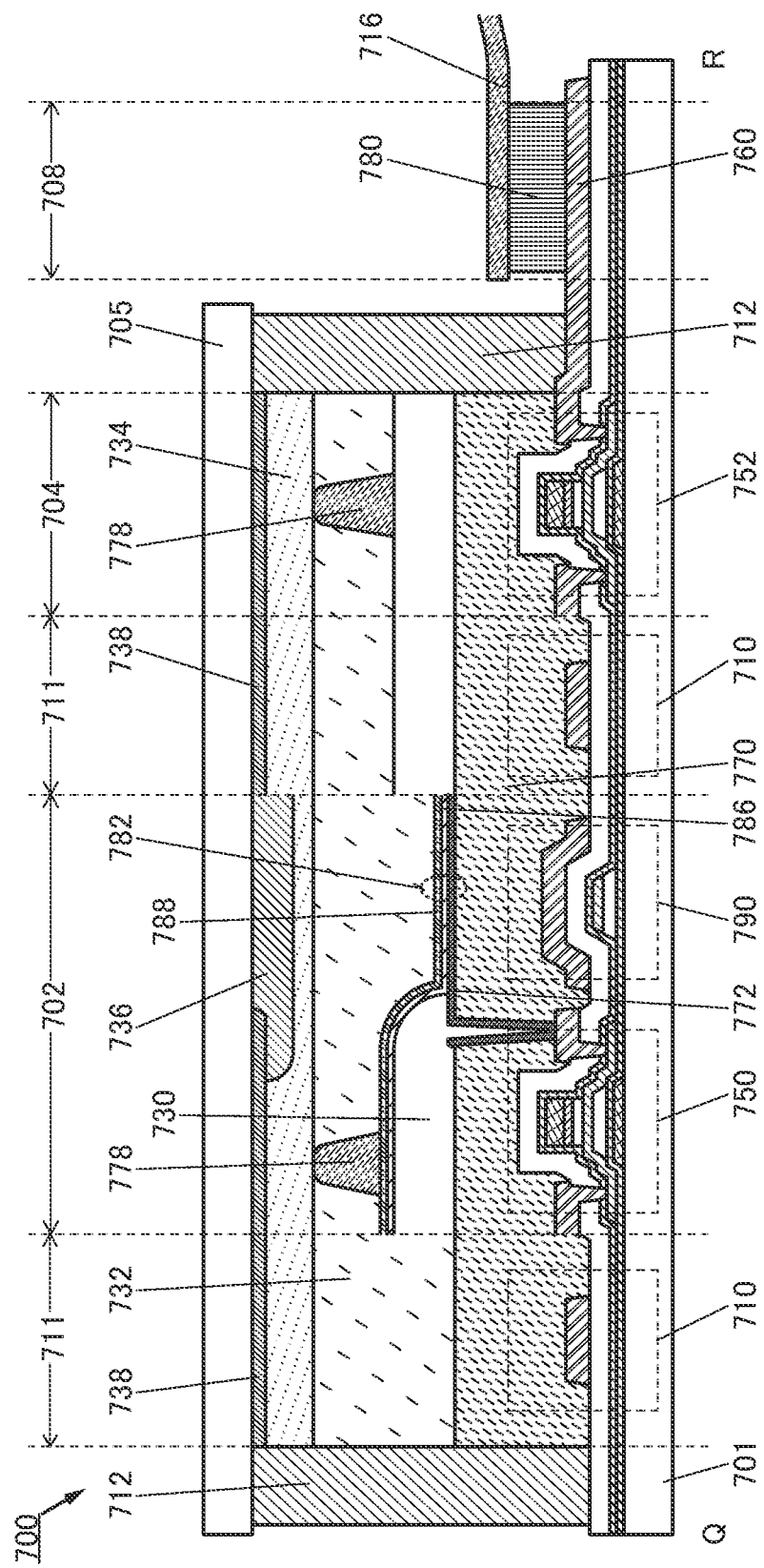
FIG. 12 A cross-sectional view of a display device.

The display device 700 illustrated in FIG. 10 to FIG. 12 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

As the transistor 750 and the transistor 752, the transistors described in Embodiment 1 can be used.

The transistor used in this embodiment includes a highly purified oxide semiconductor film in which formation of oxygen vacancies is suppressed. The transistor can have a low off-state current. Accordingly, the holding time of an electric signal such as an image signal can be made longer, and the interval between write operations of image signals and the like can also be set longer in a power-on state. Accordingly, the frequency of refresh operations can be reduced, resulting in an effect of reducing power consumption.

The transistor used in this embodiment can have relatively high field-effect mobility and thus is capable of high-speed driving. For example, with the use of such a transistor capable of high-speed driving in a display device, a switching transistor in a pixel portion and a driver transistor used in a driver circuit portion can be formed over one substrate. That is, a semiconductor device formed with a silicon wafer or the like does not need to be used separately as the driver circuit, which enables a reduction in the number of components of the display device. Moreover, the use of the transistor capable of high-speed driving in the pixel portion can provide a high-quality image.

The capacitor 790 includes a lower electrode formed in such a manner that the same film as the semiconductor layer of the transistor 750 is processed and the resistance is lowered, and an upper electrode formed by processing the same conductive film as that for a source electrode or a drain electrode. Furthermore, two insulating films covering the transistor 750 are provided between the lower electrode and the upper electrode. That is, the capacitor 790 has a stacked-layer structure in which the insulating films functioning as dielectric films are positioned between a pair of electrodes.

A planarization insulating film 770 is provided over the transistor 750, the transistor 752, and the capacitor 790.

As the transistor 750 included in the pixel portion 702 and the transistor 752 included in the source driver circuit portion 704, transistors having different structures may be used. For example, a top-gate transistor may be used as one of the transistors and a bottom-gate transistor may be used as the other. Note that the source driver circuit portion 704 described above may be replaced with a gate driver circuit portion.

The signal line 710 is formed using the same conductive as that for the source electrodes and the drain electrodes of the transistors 750 and 752, and the like. Here, a low-resistance material such as a material containing a copper element is preferably used, in which case signal delay or the like due to wiring resistance or the like can be reduced and display on a large screen is possible.

The FPC terminal portion 708 includes a connection electrode 760, an anisotropic conductive film 780, and the FPC 716. The connection electrode 760 is electrically connected to a terminal included in the FPC 716 through the anisotropic conductive film 780. Here, the connection electrode 760 is formed using the same conductive film as that for the source electrodes and the drain electrodes of the transistors 750 and 752, and the like.

As the first substrate 701 and the second substrate 705, a glass substrate or a flexible substrate such as a plastic substrate can be used, for example.

On the second substrate 705 side, a light-blocking film 738, a coloring film 736, and an insulating film 734 that is in contact with these films are provided.

[Structure Examples of Display Device using Liquid Crystal Element]

The display device 700 illustrated in FIG. 10 includes a liquid crystal element 775. The liquid crystal element 775 includes a conductive film 772, a conductive film 774, and a liquid crystal layer 776 therebetween. The conductive film 774 is provided on the second substrate 705 side and has a function of a common electrode. The conductive film 772 is electrically connected to the source electrode or the drain electrode included in the transistor 750. The conductive film 772 is formed over the planarization insulating film 770 and functions as a pixel electrode.

For the conductive film 772, a material having a property of transmitting visible light or a material having a property of reflecting visible light can be used. An oxide material containing In, Zn, Sn, or the like is preferably used as the light-transmitting material, for example. A material containing Al, Ag, or the like is preferably used as the reflective material, for example.

When a reflective material is used for the conductive film 772, the display device 700 is a reflective liquid crystal display device. On the other hand, when a light-transmitting material is used for the conductive film 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates are provided such that the liquid crystal element is sandwiched therebetween.

The display device 700 illustrated in FIG. 11 is an example in which the liquid crystal element 775 in a horizontal electric field mode (e.g., an FFS mode) is used. The conductive film 774 functioning as a common electrode is provided over the conductive film 772 with an insulating film 773 therebetween. The alignment state of the liquid crystal layer 776 can be controlled by electric fields generated between the conductive film 772 and the conductive film 774.

Although not illustrated in FIG. 10 and FIG. 11, an alignment film in contact with the liquid crystal layer 776 may be provided. An optical member (an optical substrate) such as a polarizing member, a retardation member, or an anti-reflection member and a light source such as a backlight or a side light can be provided as appropriate.

For the liquid crystal layer 776, thermotropic liquid crystal, low-molecular liquid crystal, high-molecular liquid crystal, polymer dispersed liquid crystal, polymer network liquid crystal, ferroelectric liquid crystal, anti-ferroelectric liquid crystal, or the like can be used. In the case of employing a horizontal electric field mode, liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell)

mode, an OCB (Optical Compensated Birefringence) mode, an ECB (Electrically Controlled Birefringence) mode, a guest-host mode, or the like can be employed.

[Display Device using Light-Emitting Element]

The display device 700 illustrated in FIG. 12 includes a light-emitting element 782. The light-emitting element 782 includes the conductive film 772, an EL layer 786, and a conductive film 788. The EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material.

In the display device 700 illustrated in FIG. 12, an insulating film 730 covering part of the conductive film 772 is provided over the planarization insulating film 770. Here, the light-emitting element 782 is a top-emission light-emitting element including the light-transmitting conductive film 788. Note that the light-emitting element 782 may have a bottom-emission structure in which light is emitted to the conductive film 772 side or a dual-emission structure in which light is emitted to both the conductive film 772 side and the conductive film 788 side.

The coloring film 736 is provided at a position overlapping the light-emitting element 782, and the light-blocking film 738 is provided at a position overlapping the insulating film 730 and in the lead wiring portion 711 and the source driver circuit portion 704. The coloring film 736 and the light-blocking film 738 are covered with the insulating film 734. A space between the light-emitting element 782 and the insulating film 734 is filled with a sealing film 732. Note that a structure without the coloring film 736 may also be employed in the case where the EL layer 786 is formed into an island shape per pixel or a stripe shape per pixel column, i.e., formed by separate coloring.

[Structure Example of Display Device Provided with Input Device]

An input device may be provided in the display device 700 illustrated in FIG. 10 to FIG. 12. An example of the input device is a touch sensor.

For example, a variety of types such as a capacitive type, a resistive type, a surface acoustic wave type, an infrared type, an optical type, and a pressure-sensitive type can be used for the sensor. Alternatively, a combination of two or more of these types may be employed.

Note that examples of a touch panel structure include what is called an in-cell touch panel in which an input device is formed on the inner side of a pair of substrates, what is called an on-cell touch panel in which an input device is formed over the display device 700, and what is called an out-cell touch panel that is bonded to the display device 700 to be used.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention will be described with reference to FIG. 13.

Figure 13A:
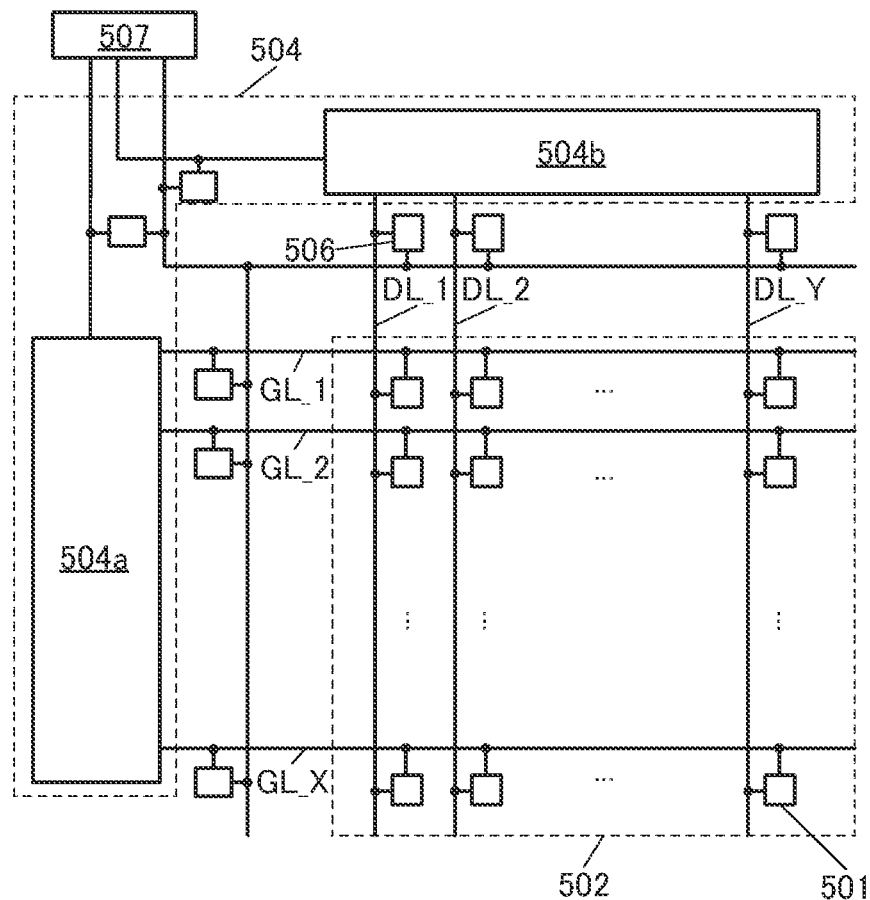
FIGS. 13A to 13C A block diagram and circuit diagrams of a display device.

A display device illustrated in FIG. 13(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 13(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 13B:
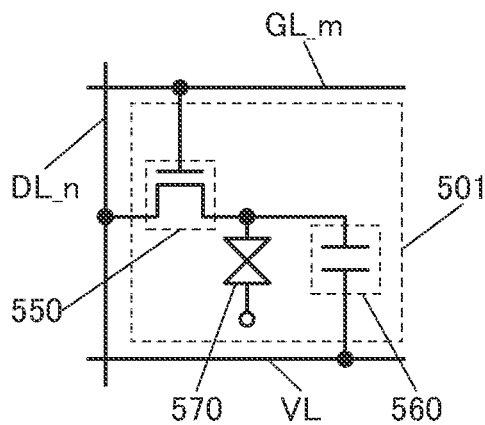
Figure 13C:
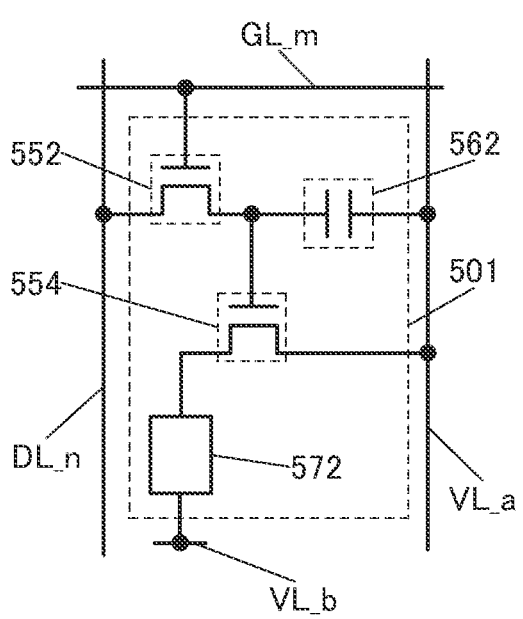

The plurality of pixel circuits 501 illustrated in FIG. 13(A) can have a configuration illustrated in FIG. 13(B) or FIG. 13(C), for example.

The pixel circuit 501 illustrated in FIG. 13(B) includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 13(C) includes transistors 552 and 554, a capacitor 562, and a light-emitting element 572. The data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

[Circuit Configuration]

Figure 14A:
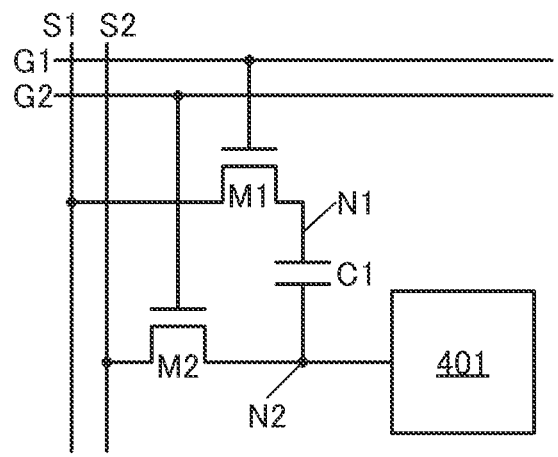
FIGS. 14A to 14D Circuit diagrams of display devices.

FIG. 14(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

Anode connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 14B:
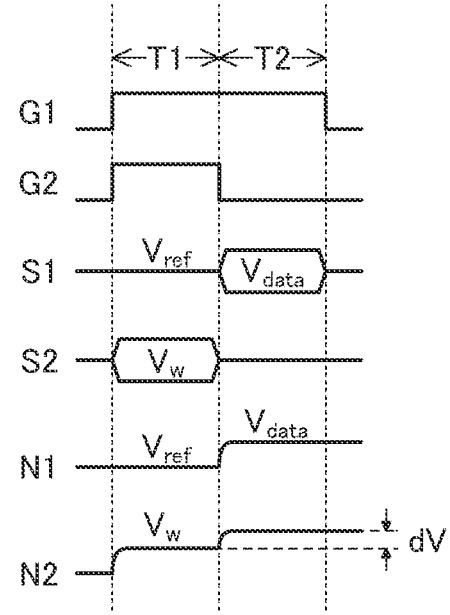

Next, an example of a method for operating the pixel circuit 400 is described with reference to FIG. 14(B). FIG. 14(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 14(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential Vw and the potential dV is input to the circuit 401. Note that although dV is shown as a positive value in FIG. 14(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Examples

[Example using Liquid Crystal Element]

Figure 14C:
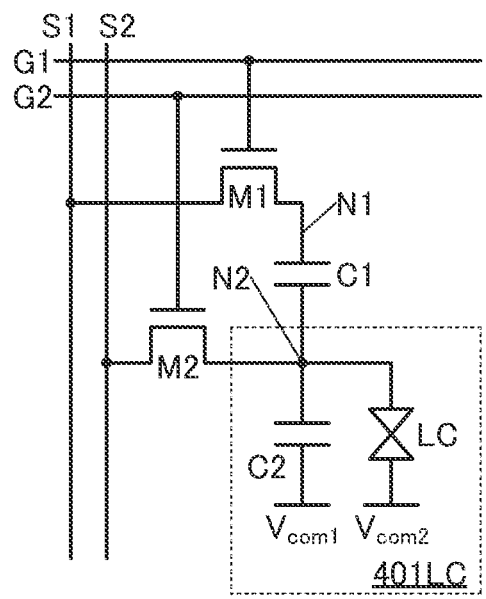

A pixel circuit 400LC illustrated in FIG. 14(C) includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example using Light-Emitting Element]

Figure 14D:
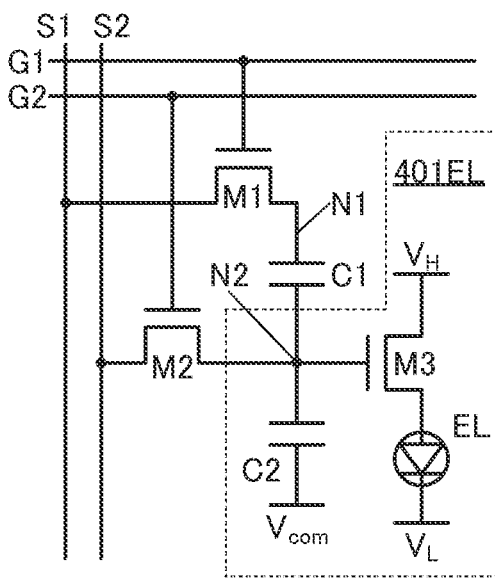

A pixel circuit 400EL illustrated in FIG. 14(D) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential VL.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, moreover, a variation in the electrical characteristics of the transistor M3 and the light-emitting element EL can be corrected by supply of a correction signal to the wiring S1 or the wiring S2.

Note that the configuration is not limited to the circuits shown in FIG. 14(C) and FIG. 14(D), and a configuration to which a transistor, a capacitor, or the like is further added may be employed.

At least part of this embodiment can be implemented in combination with the other embodiments described in this specification as appropriate.

Embodiment 5

In this embodiment, a display module that can be manufactured using one embodiment of the present invention will be described.

Figure 15A:
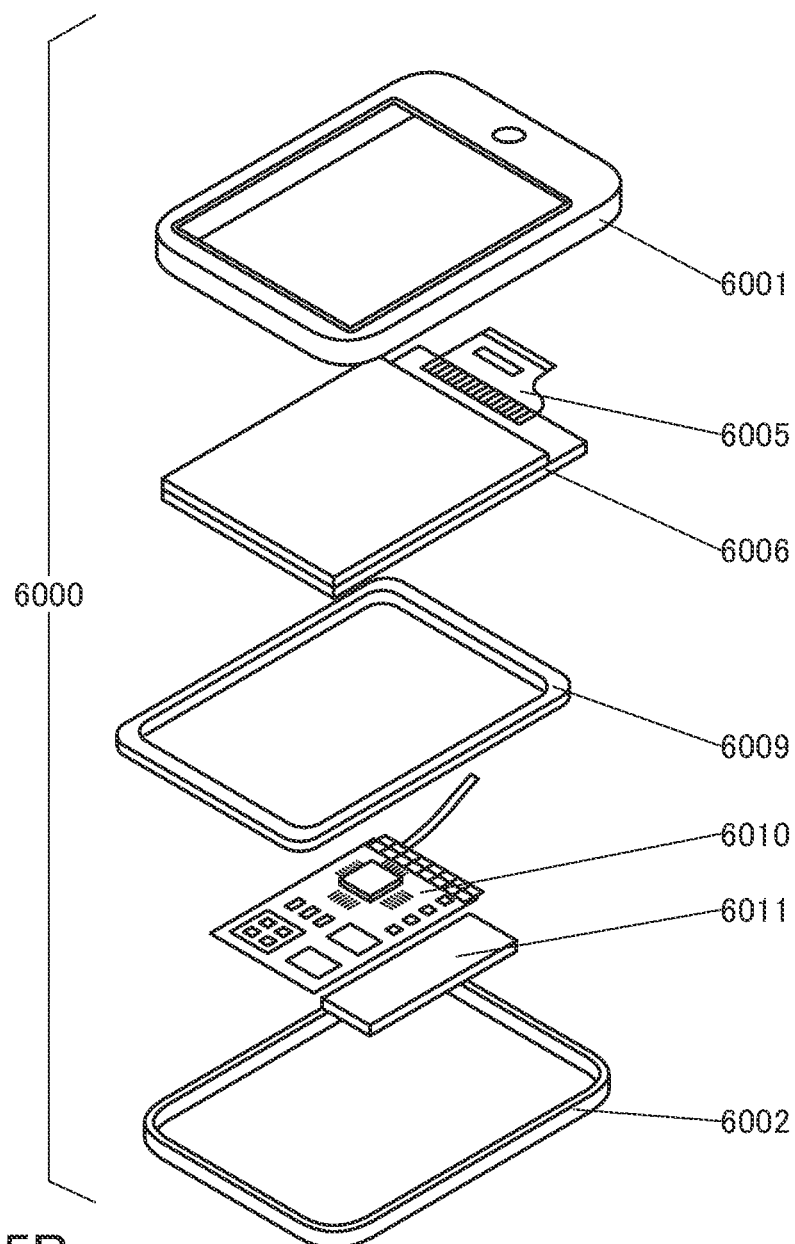
FIGS. 15A and 15B A structure example of a display module.

In a display module 6000 illustrated in FIG. 15(A), a display device 6006 to which an FPC 6005 is connected, a frame 6009, a printed circuit board 6010, and a battery 6011 are provided between an upper cover 6001 and a lower cover 6002.

A display device manufactured using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 15B:
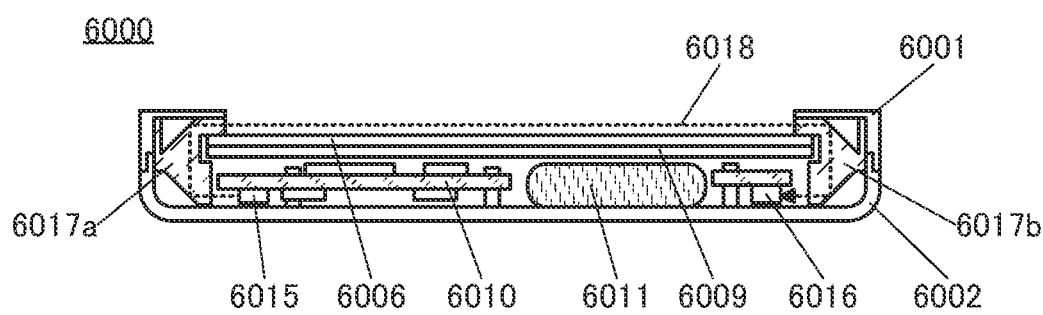

FIG. 15(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be favorably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 6

In this embodiment, electronic devices each including a display device manufactured using one embodiment of the present invention will be described.

Electronic devices shown below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

Figure 16A:
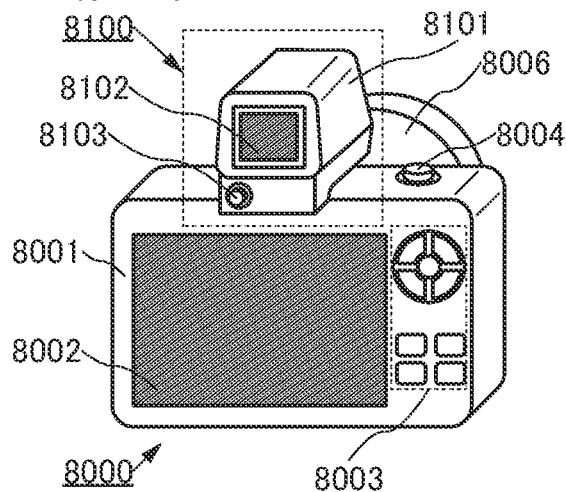
FIGS. 16A to 16E Structure examples of electronic devices.

FIG. 16(A) is a diagram illustrating the appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video received from the camera 8000 and the like on the display portion 8102.

The button 8103 has a function of a power button or the like.

A display device of one embodiment of the present invention can be used in the display portion 8002 of the camera 8000 and the display portion 8102 of the finder 8100. Note that a finder may be incorporated in the camera 8000.

Figure 16B:
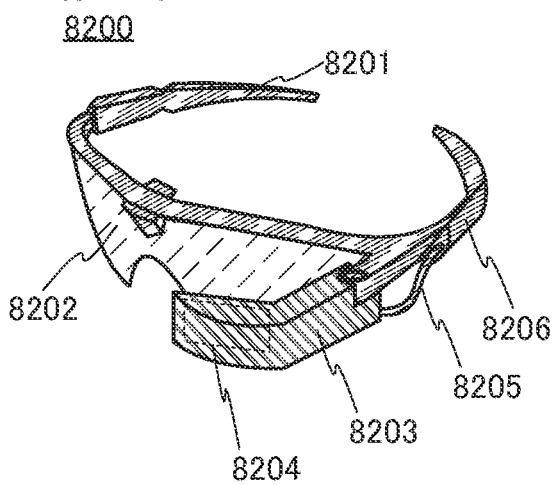

FIG. 16(B) is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and information on the movement of the user's eyeball and eyelid can be used as an input means.

In the mounting portion 8201, a plurality of electrodes capable of sensing current flowing in response to the movement of the user's eyeballs may be provided at positions in contact with the user so that the mounting portion 8201 can have a function of recognizing the user's gaze. A function of monitoring the user's pulse with the use of current flowing through the electrodes may be provided. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used in the display portion 8204.

Figure 16C:
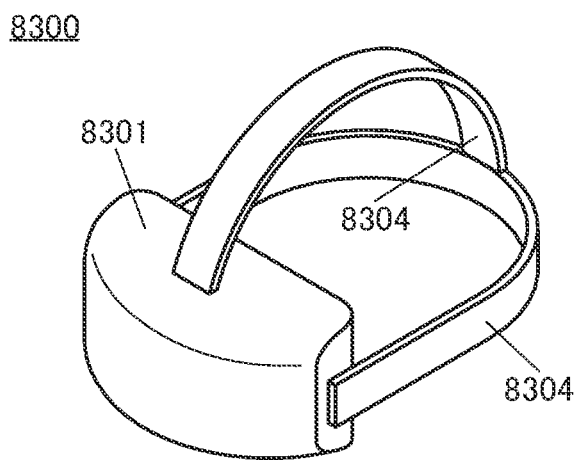
Figure 16D:
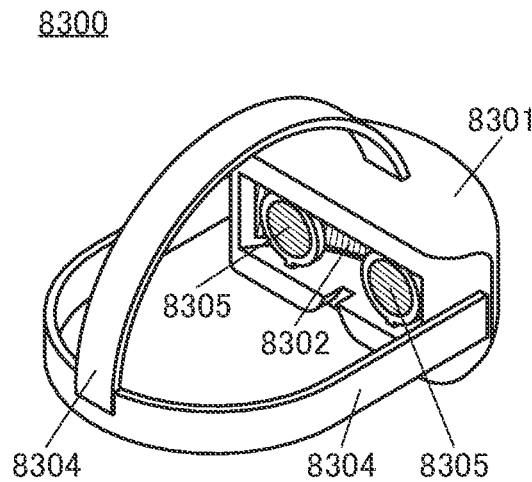
Figure 16E:
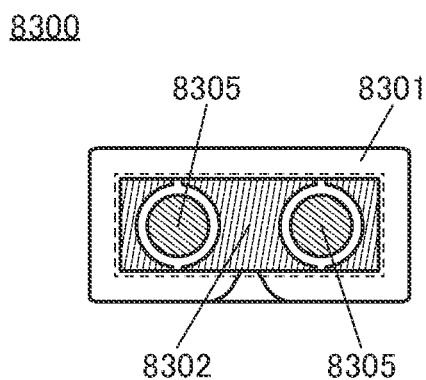

FIGS. 16(C), 16(D), and 16(E) are diagrams illustrating the appearance of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that the display portion 8302 is preferably installed in a state of being curved, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 16(E), a more realistic video can be displayed while the user does not see individual pixels.

Electronic devices illustrated in FIG. 17(A) to FIG. 17(G) include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 17(A) to FIG. 17(G) have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, and the like.

The details of the electronic devices illustrated in FIG. 17(A) to FIG. 17(G) are described below.

Figure 17A:
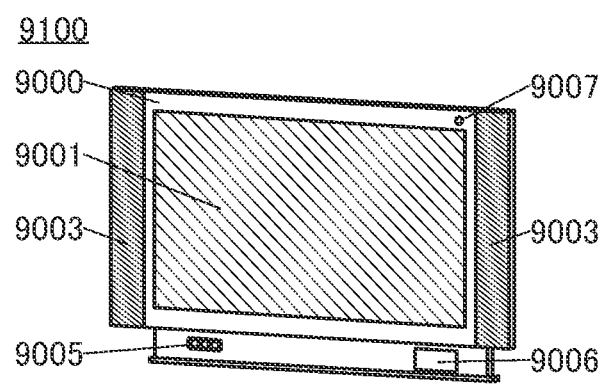
FIGS. 17A to 17G Structure examples of electronic devices.

FIG. 17(A) is a perspective view illustrating a television device 9100. The television device 9100 can include the display portion 9001 having a large screen size of, for example, 50 inches or more, or 100 inches or more.

Figure 17D:
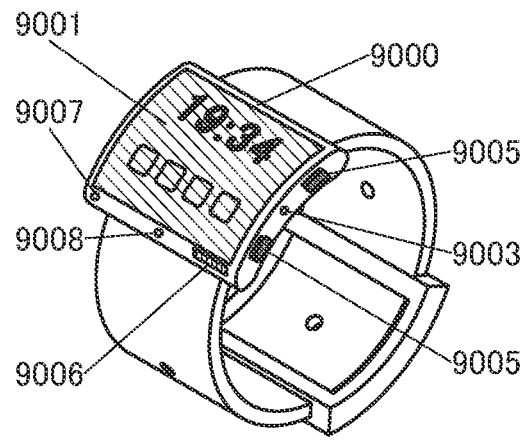
Figure 17B:
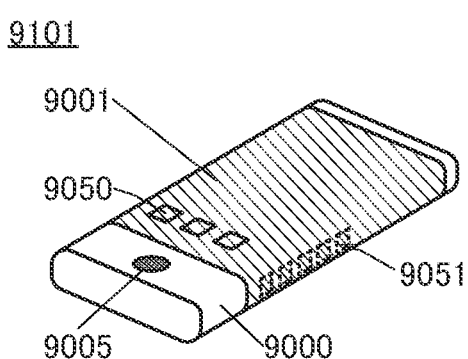

FIG. 17(B) is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters and image information on its plurality of surfaces. FIG. 17(B) shows an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed at the position where the information 9051 is displayed.

Figure 17E:
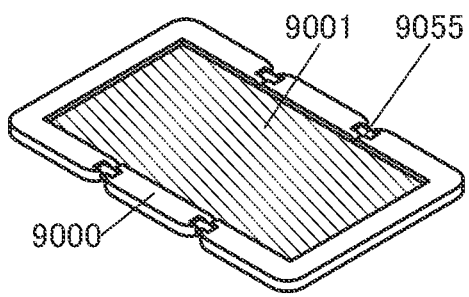
Figure 17C:
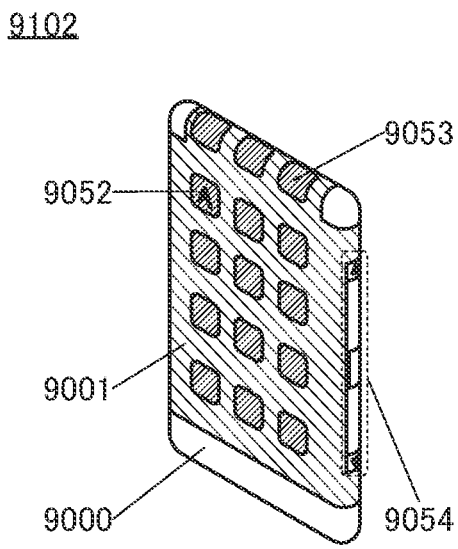

FIG. 17(C) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 17(D) is a perspective view illustrating a watch-type portable information terminal 9200. The portable information terminal 9200 can be used as a smart watch, for example. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 17F:
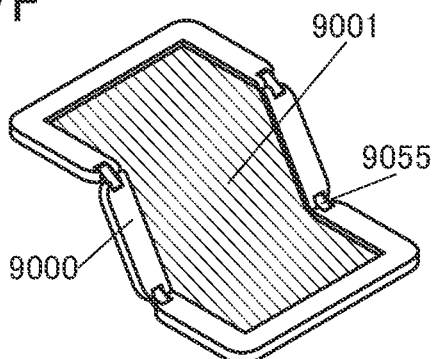
Figure 17G:
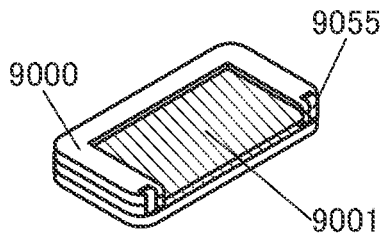

FIGS. 17(E), 17(F), and 17(G) are perspective views illustrating a foldable portable information terminal 9201. FIG. 17(E) is a perspective view of an opened state of the portable information terminal 9201, FIG. 17(G) is a perspective view of a folded state thereof, and FIG. 17(F) is a perspective view of a state in the middle of change from one of FIG. 17(E) and FIG. 17(G) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 18A:
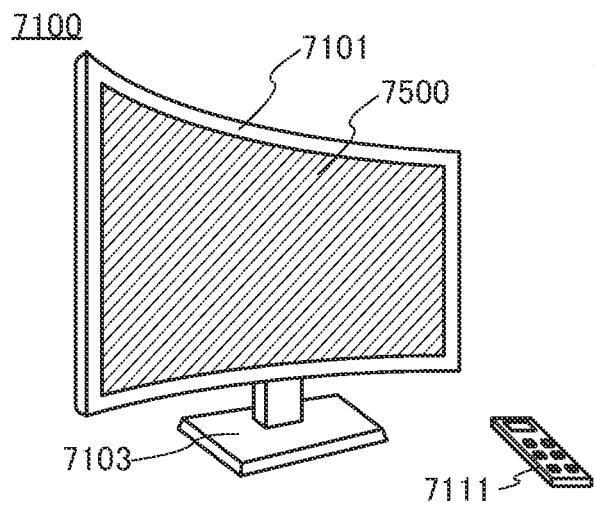
FIGS. 18A to 18D Structure examples of electronic devices.

FIG. 18(A) illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 18(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 18B:
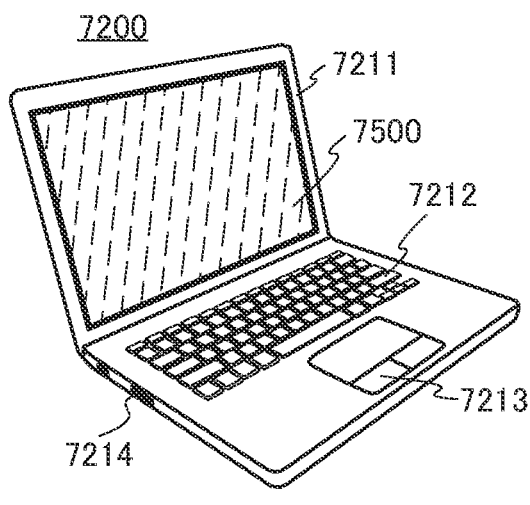

FIG. 18(B) illustrates a laptop personal computer 7200. The laptop personal computer 7200 includes a housing 7211, a keyboard 7212, a pointing device 7213, an external connection port 7214, and the like. The display portion 7500 is incorporated in the housing 7211.

Figure 18C:
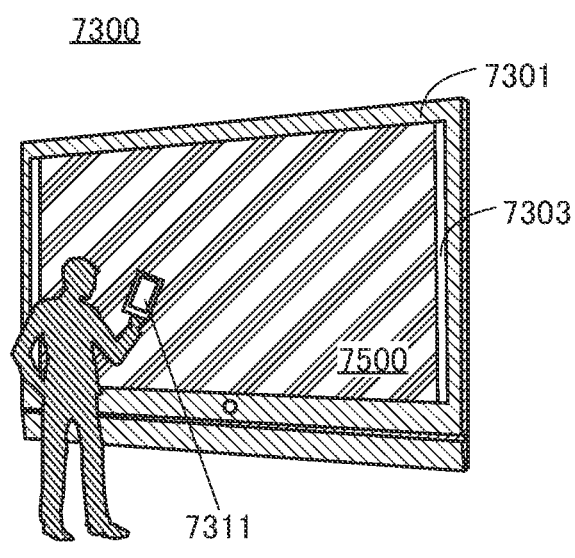
Figure 18D:
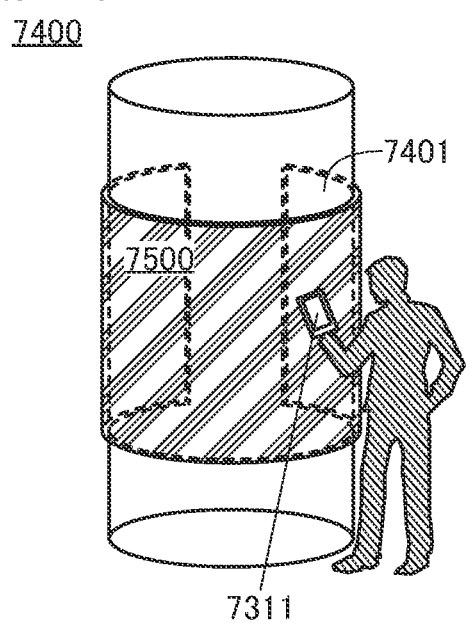

FIGS. 18(C) and 18(D) illustrate examples of digital signage.

Digital signage 7300 illustrated in FIG. 18(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 18(D) is digital signage 7400 attached to a cylindrical pillar 7401. The digital signage 7400 includes the display portion 7500 provided along a curved surface of the pillar 7401.

A larger display portion 7500 can increase the amount of information that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIGS. 18(C) and 18(D), it is preferable that the digital signage 7300 or the digital signage 7400 can work with an information terminal 7311, such as a user's smartphone, through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 18(A) to 18(D).

The electronic devices of this embodiment each include a display portion; however, one embodiment of the present invention can also be applied to an electronic device without a display portion.

At least part of this embodiment can be implemented in combination with the other embodiments described in this specification as appropriate.

Example

In this example, a transistor of one embodiment of the present invention was fabricated and its electrical characteristics were evaluated.

[Sample Fabrication]

For the structure of the fabricated transistor, the transistor 100B shown in Embodiment 1 and FIG. 3 can be employed. For comparison, a transistor in which an oxide film corresponding to the insulating layer 104 was not processed was also fabricated.

As the first gate electrode, an approximately 100-nm-thick tungsten film formed over a glass substrate by a sputtering method was used.

As the first gate insulating layer, an approximately 400-nm-thick silicon nitride film and an approximately 50-nm-thick silicon oxynitride film each formed by a plasma CVD method were used. Moreover, the silicon oxynitride film was processed using the same photomask as that for the aftermentioned second gate electrode.

As the semiconductor layer, an approximately 40-nm-thick metal oxide film deposited by a sputtering method using an In—Ga—Zn oxide target was used.

As the second gate insulating layer, an approximately 150-nm-thick silicon oxynitride film deposited by a plasma CVD method was used. Moreover, an opening reaching the first gate electrode was formed in the second gate insulating layer and the first gate insulating layer.

As the second gate electrode, a metal oxide film deposited by a sputtering method using the In—Ga—Zn oxide target, which is the same as the one used to form the semiconductor layer, was used.

The second gate electrode and the second gate insulating layer were processed using the same mask so that portions of the semiconductor layer to be a source region and a drain region were exposed. The second gate electrode and the first gate electrode were electrically connected to each other through the above-described opening.

As the protective insulating layer, a stack including an approximately 100-nm-thick silicon nitride film containing hydrogen and an approximately 300-nm-thick silicon oxynitride film, each of which was formed by a plasma CVD method, was used. Moreover, an opening reaching the semiconductor layer was formed in the protective insulating layer.

The source electrode and the drain electrode employed a stacked-layer structure of an approximately 50-nm-thick titanium film, an approximately 400-nm-thick aluminum film, and an approximately 100-nm-thick titanium film, each of which was formed by a sputtering method. Moreover, an acrylic film was formed as a protective film over the source electrode and the drain electrode.

Through the above steps, Sample A including the transistor formed over the glass substrate was fabricated. In addition, a comparative sample in which the silicon oxynitride films in the above gate insulating layers were not processed was fabricated in a similar manner.

[Id-Vg Characteristics of Transistors]

Id-Vg characteristics of Sample A and the comparative sample fabricated as above were measured. As for the size of the measured transistors, the channel length was approximately 3 μm and the channel width was approximately 3 μm. The number of measurements was 20.

As the conditions for measuring the Id-Vg characteristics of the transistors, a voltage applied to the first gate electrode and the second gate electrode (hereinafter also referred to as a gate voltage (Vg)) was applied from −15 V to +20 V in increments of 0.25 V. Moreover, a voltage applied to the source electrode (hereinafter also referred to as a source voltage (Vs)) was 0 V (comm), and a voltage applied to the drain electrode (hereinafter also referred to as a drain voltage (Vd)) was 0.1 V and 10 V.

Figure 19A:
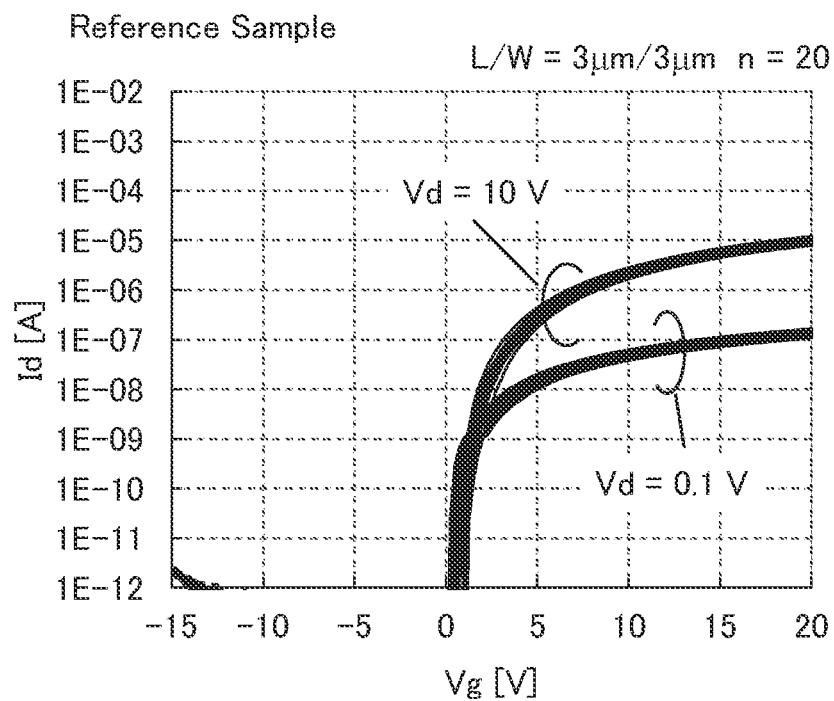
FIGS. 19A and 19B Electrical characteristics of transistors in Example.
Figure 19B:
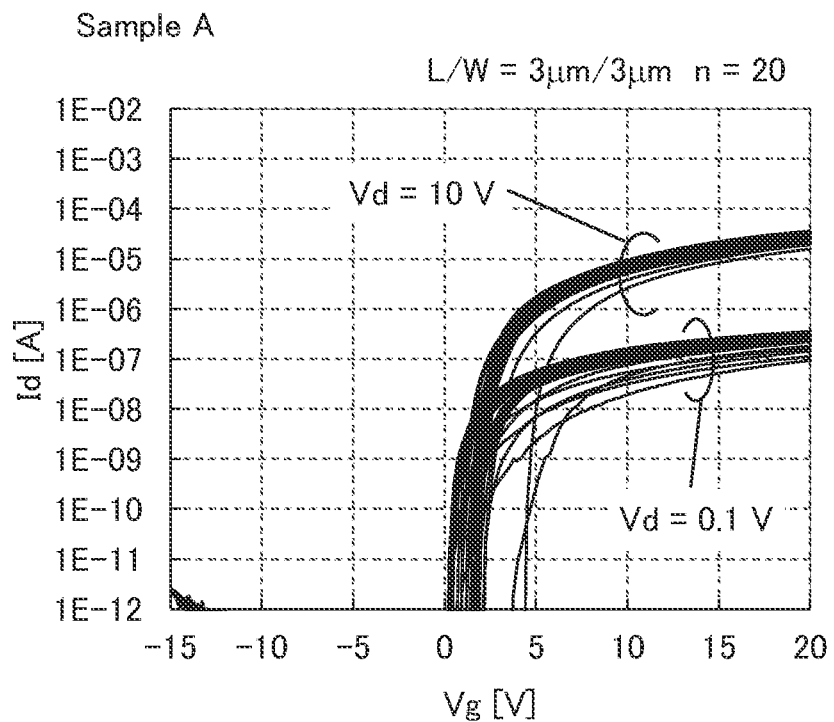

FIG. 19(A) shows the Id-Vg characteristics of the comparative sample (Reference Sample), and FIG. 19(B) shows the Id-Vg characteristics of Sample A.

As shown in FIGS. 19(A) and 19(B), it was found that although characteristics variations are slightly large, Sample A shows higher current-voltage characteristics than the comparative sample and obtains favorable transistor characteristics.

The above results demonstrated that processing the oxide layer provided under the semiconductor layer to be in contact with the channel formation region and not to be in contact with the source region and the drain region inhibits the increase in the resistance of the source region and the drain region and achieves high current-voltage characteristics.

Reference Numerals 100, 100A, 100B: transistor; 102: substrate; 103, 104, 104a, 110, 116, 118: insulating layer; 104f, 110f: insulating film; 106, 112, 120a, 120b, 131: conductive layer; 108: semiconductor layer; 108n: region; 114: metal oxide layer; 114f: metal oxide film; 141a, 141b, 142: opening

The invention claimed is:

1. A transistor comprising:
a silicon oxide layer;
a silicon nitride layer;
an oxide semiconductor layer over the silicon oxide layer and the silicon nitride layer, the oxide semiconductor layer comprising a channel formation region and a second region which is not the channel formation region; and
a gate electrode over the channel formation region of the oxide semiconductor layer with a gate insulating layer therebetween,
wherein the oxide semiconductor layer comprises indium, gallium and zinc,
wherein the silicon oxide layer comprises a region which contacts the channel formation region of the oxide semiconductor layer,
wherein the silicon nitride layer comprises a region which contacts the second region of the oxide semiconductor layer, and
wherein an upper portion of the second region of the oxide semiconductor layer has a lower resistance than the channel formation region of the oxide semiconductor layer.

2. A transistor comprising:
a first insulating layer;
a second insulating layer;
an oxide semiconductor layer over the first insulating layer and the second insulating layer, the oxide semiconductor layer comprising a channel formation region and a second region which is not the channel formation region; and
a gate electrode over the channel formation region of the oxide semiconductor layer with a gate insulating layer therebetween,
wherein the oxide semiconductor layer comprises indium, gallium and zinc,
wherein the first insulating layer contacts the channel formation region of the oxide semiconductor layer,
wherein the second insulating layer contacts the second region of the oxide semiconductor layer,
wherein the first insulating layer comprises an oxide insulating material,
wherein the second insulating layer is less likely to diffuse oxygen than the first insulating layer, and
wherein an upper portion of the second region of the oxide semiconductor layer has a lower resistance than the channel formation region of the oxide semiconductor layer.

3. The transistor according to claim 2, wherein the first insulating layer comprises a material selected from the group consisting of silicon oxide, silicon oxynitride, and aluminum oxide.

4. The transistor according to claim 2, wherein the second insulating layer comprise a material selected from the group consisting of aluminum oxide, hafnium oxide, hafnium aluminate, aluminum nitride, aluminum nitride oxide, silicon nitride and silicon nitride oxide.

5. The transistor according to claim 1, wherein the gate insulating layer comprises a material selected from the group consisting of silicon nitride, silicon oxynitride and aluminum oxide.

6. The transistor according to claim 2, wherein the gate insulating layer comprises a material selected from the group consisting of silicon nitride, silicon oxynitride and aluminum oxide.

7. A semiconductor device comprising:
a first insulating layer comprising an oxide;
a second insulating layer comprising a nitride;
an oxide semiconductor layer over the first insulating layer and the second insulating layer, the oxide semiconductor layer comprising indium, gallium and zinc,
wherein the oxide semiconductor layer comprises a channel formation region and a low-resistance region having a lower resistance than the channel formation region;
a gate insulating layer over and in contact with the channel formation region of the oxide semiconductor layer;
a gate electrode over the channel formation region with the gate insulating layer therebetween;
a metal nitride layer over and in contact with the low-resistance region of the oxide semiconductor layer;
a third insulating layer over the metal nitride layer, the third insulating layer comprising hydrogen; and
a conductive layer over the third insulating layer,
wherein the conductive layer is in contact with the low-resistance region of the oxide semiconductor layer through an opening of the third insulating layer and an opening of the metal nitride layer.

8. The semiconductor device according to claim 7, wherein the gate insulating layer comprises aluminum oxide.

9. The semiconductor device according to claim 7, wherein the first insulating layer comprises silicon oxide.

10. The semiconductor device according to claim 7, wherein the second insulating layer comprises silicon nitride.

11. The semiconductor device according to claim 7, wherein the metal nitride layer comprises titanium nitride.

12. A semiconductor device comprising:
a first insulating layer comprising an oxide;
a second insulating layer comprising a nitride;
an oxide semiconductor layer over the first insulating layer and the second insulating layer, the oxide semiconductor layer comprising indium, gallium and zinc,
wherein the oxide semiconductor layer comprises a channel formation region and a low-resistance region having a lower resistance than the channel formation region;
a gate insulating layer over and in contact with the channel formation region of the oxide semiconductor layer;
a gate electrode over the channel formation region with the gate insulating layer therebetween;
a titanium nitride layer over and in contact with the low-resistance region of the oxide semiconductor layer;
a third insulating layer over the titanium nitride layer, the third insulating layer comprising hydrogen; and
a conductive layer over the third insulating layer,
wherein the conductive layer is in contact with the low-resistance region of the oxide semiconductor layer through an opening of the third insulating layer.

13. The semiconductor device according to claim 12, wherein the gate insulating layer comprises aluminum oxide.

14. The semiconductor device according to claim 12, wherein the first insulating layer comprises silicon oxide.

15. The semiconductor device according to claim 12, wherein the second insulating layer comprises silicon nitride.

16. The semiconductor device according to claim 12, wherein the conductive layer is in contact with the low-resistance region of the oxide semiconductor layer through the opening of the third insulating layer and an opening of the titanium nitride layer.

* * * * *